United States Patent [19]
Schubert et al.

[11] Patent Number: 5,823,307
[45] Date of Patent: *Oct. 20, 1998

[54] STIFF ACTUATOR ACTIVE VIBRATION ISOLATION SYSTEM

[75] Inventors: Dale W. Schubert, Sudbury; Andrew Michael Beard, Winchester; Steven Frank Shedd, Plympton; Marion Richard Earles, Jr., Marlboro, all of Mass.; Andreas H. Von Flotow, Hood River, Oreg.

[73] Assignee: Technical Manufacturing Corporation, Peabody, Mass.

[*] Notice: The term of this patent shall not extend beyond the expiration date of Pat. No. 5,660,255.

[21] Appl. No.: 850,045

[22] Filed: May 2, 1997

Related U.S. Application Data

[63] Continuation of Ser. No. 223,256, Apr. 4, 1994, Pat. No. 5,660,255.

[51] Int. Cl.⁶ ............................................. F16F 7/10
[52] U.S. Cl. ................................... 188/378; 267/136
[58] Field of Search .................... 188/378, 379, 188/380; 267/136, 221, 34; 280/707, 714; 303/3, 15

[56] References Cited

U.S. PATENT DOCUMENTS

| | | | |
|---|---|---|---|
| 3,701,499 | 10/1972 | Schubert et al. | 244/17.27 |
| 3,807,678 | 4/1974 | Karnopp et al. | 248/358 R |
| 4,742,998 | 5/1988 | Schubert | 267/136 |
| 4,757,980 | 7/1988 | Schubert | 267/136 |
| 4,796,873 | 1/1989 | Schubert | 267/136 |
| 4,821,205 | 4/1989 | Schutten et al. | 364/508 |
| 4,838,392 | 6/1989 | Miller et al. | 188/277 |
| 4,887,699 | 12/1989 | Ivers et al. | 188/378 |
| 4,898,264 | 2/1990 | Miller | 188/275 |
| 4,907,680 | 3/1990 | Wolfe et al. | 188/299 |
| 4,921,272 | 5/1990 | Ivers | 280/707 |
| 4,936,425 | 6/1990 | Boone et al. | 188/299 |
| 4,953,089 | 8/1990 | Wolfe | 364/424.05 |
| 4,989,684 | 2/1991 | Conaway | 180/89.15 |
| 4,993,523 | 2/1991 | Schwemmer et al. | 188/299 |
| 5,000,415 | 3/1991 | Sandercock | 248/550 |
| 5,004,079 | 4/1991 | Ivers et al. | 188/282 |
| 5,109,939 | 5/1992 | Conaway et al. | 180/89.15 |
| 5,174,552 | 12/1992 | Hodgson et al. | 267/140.11 |
| 5,253,853 | 10/1993 | Conaway et al. | 267/256 |
| 5,255,764 | 10/1993 | Kurabayashi et al. | 100/380 |
| 5,390,121 | 2/1995 | Wolfe | 364/424.05 |

FOREIGN PATENT DOCUMENTS

| | | |
|---|---|---|
| 0 509 911 | 10/1992 | European Pat. Off. . |
| 0 556 033 | 8/1993 | European Pat. Off. . |
| 0 579 182 | 1/1994 | European Pat. Off. . |
| 61-286634 | 12/1986 | Japan . |
| 63-92851 | 4/1988 | Japan . |
| 2-102945 | 4/1990 | Japan . |
| 3-292433 | 12/1991 | Japan . |
| 4-339019 | 11/1992 | Japan . |
| 5-149379 | 6/1993 | Japan . |
| 5-238435 | 9/1993 | Japan . |
| 5-346136 | 12/1993 | Japan . |
| 6-107242 | 4/1994 | Japan . |
| 2 222 657 | 6/1990 | United Kingdom . |
| 2 277 360 | 10/1994 | United Kingdom . |
| WO93/19973 | 10/1993 | WIPO . |

*Primary Examiner*—Peter M. Poon
*Attorney, Agent, or Firm*—Quarles & Brady

[57] ABSTRACT

An active vibration isolation system (10) includes a plurality of stiff actuators, such as piezoelectric motors (12a–c; 284, 350) which support a small mass (18) inside of a case (300). A passive isolator (20) is interposed between the small mass (18) and the payload mass ($M_p$). In the instance where the stiff actuators are piezoelectric motors, the sidewalls of the case (300) are used to provide compressive force along the variable length of each of the horizontal piezoelectric motor elements (284, 350) to prevent damage to same. Compensation circuitry (24) is connected between velocity sensors (17) and the stiff actuators to control the variable length thereof in this move-out-of-the-way system (10) and to compensate for resonating modes. Optionally, a payload mass velocity sensor (26) and associated circuitry may be used to provide additional control. Shear decouplers (282a–c; 352, 360) are used in conjunction with the piezoelectric motor elements (12a–c; 284, 350) to minimize the amount of shear force acting on the motor elements.

19 Claims, 22 Drawing Sheets

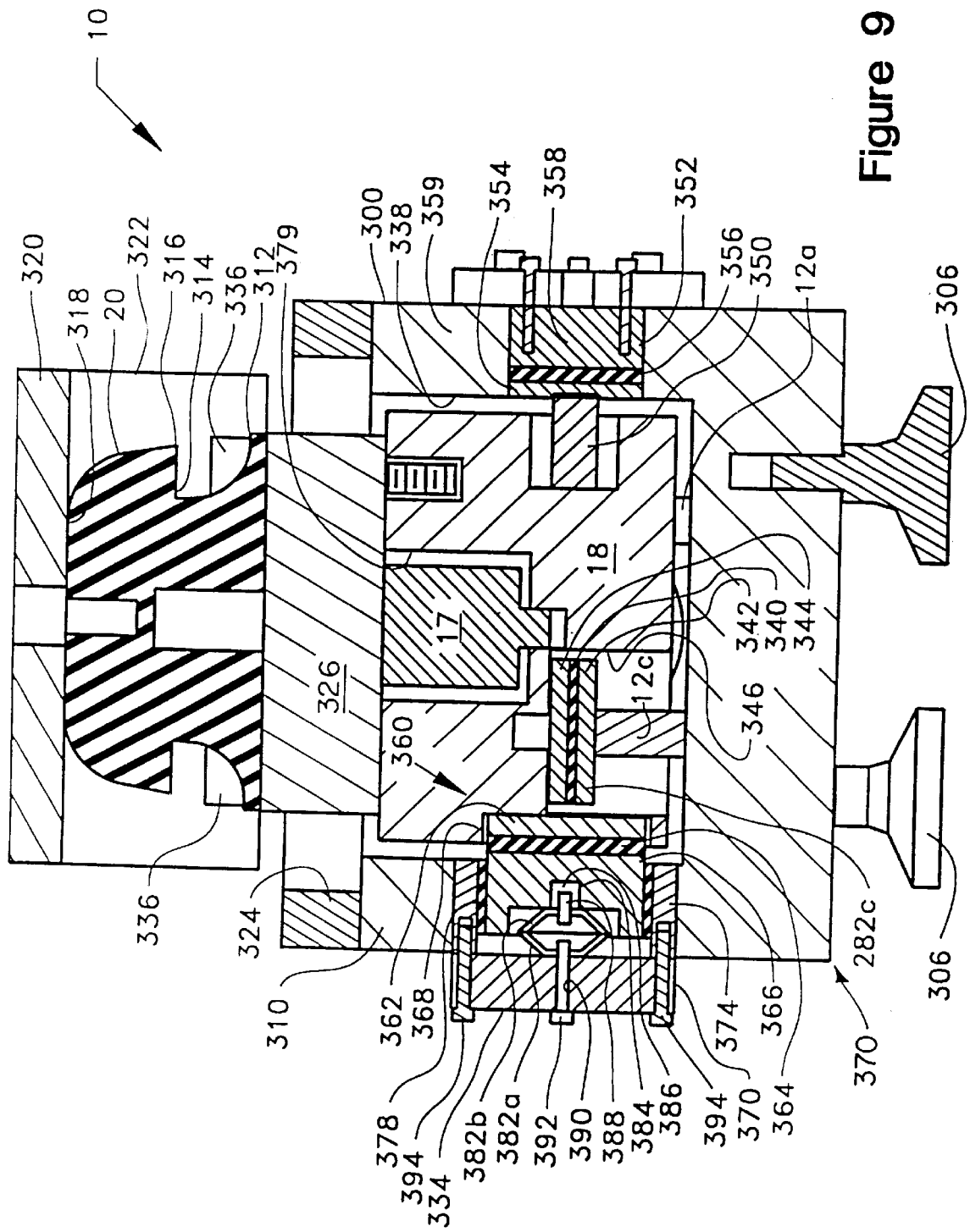

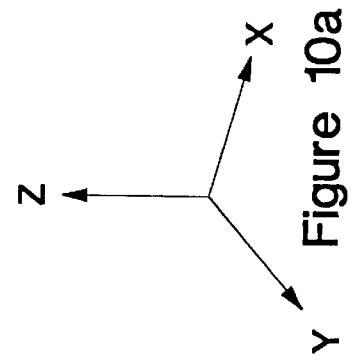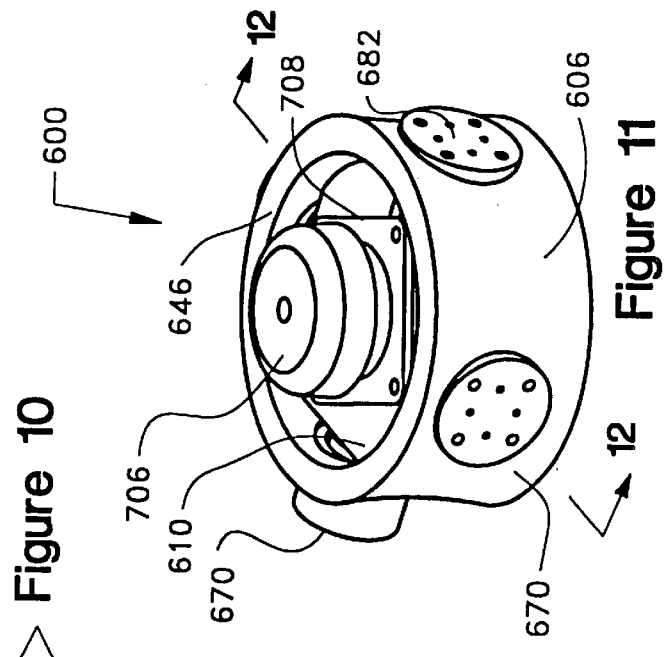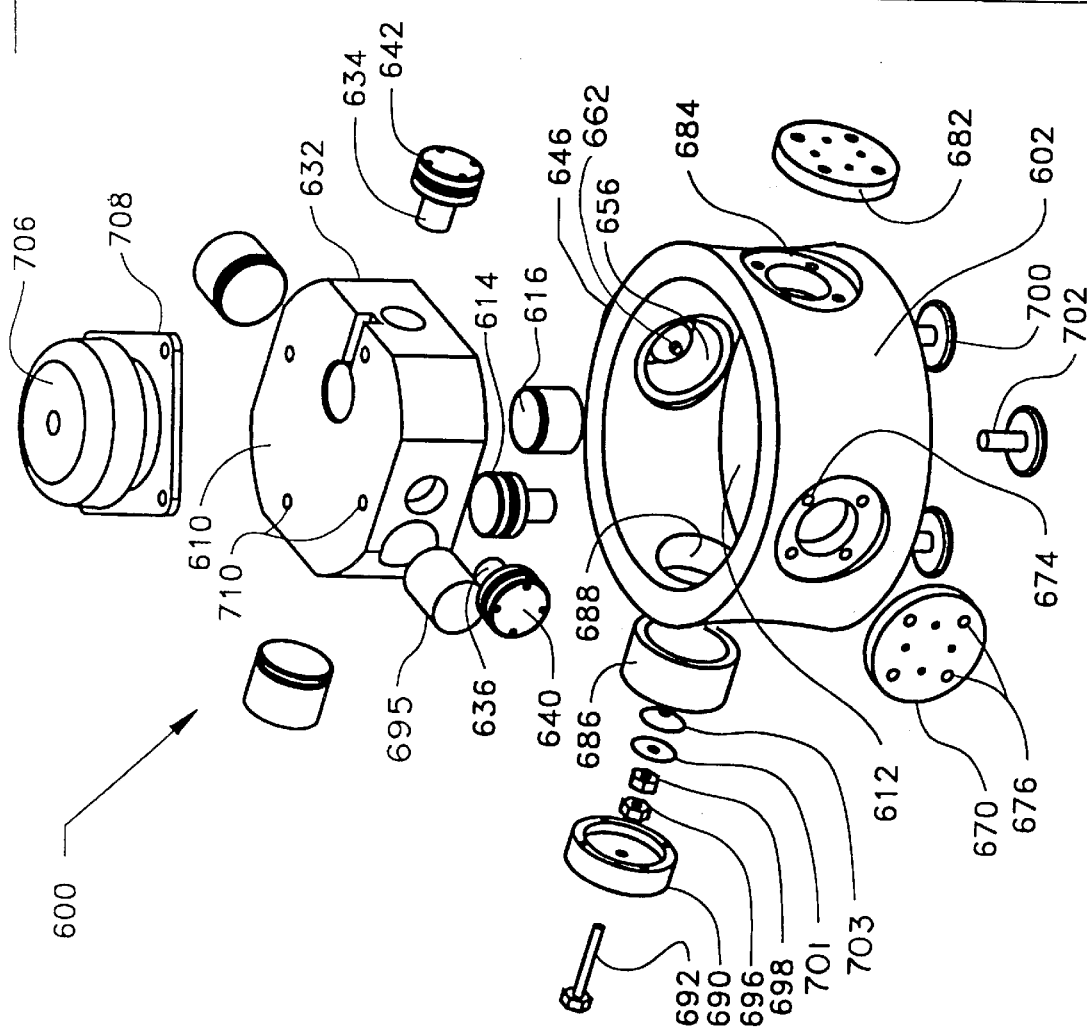

STIFF ACTUATOR ACTIVE VIBRATION ISOLATION SYSTEM

This is a continuation of application Ser. No. 08/223,256 filed on Apr. 4, 1994, now U.S. Pat. No. 5,660,255.

TECHNICAL FIELD OF THE INVENTION

The present invention relates to methods and apparatus for removing vibration from supported payloads, and more particularly to an active vibration isolation system using sensors and stiff actuators.

BACKGROUND OF THE INVENTION

The need in industry for vibration isolation is growing. For example, there is less and less tolerance for environmental vibration in ultraviolet steppers used in semiconductor manufacturing. As the manufacturing of semiconductors and other products becomes more and more precise, the need for suppressing environmental vibration becomes greater and greater.

Workers in the art have conceived of a theoretical active vibration isolation system which uses force motors, such as voice coil motor elements, and sensors on the isolated payload to measure the absolute motion of the payload relative to inertial space. So far, these prior art conceptions and arrangements have not been fully practical because the coupling of payload resonances with sensed outputs compromise stability margins.

In the simplest possible piezoelectric active vibration isolation system, a system resonance frequency is formed by the spring stiffness of the piezoelectric motor elements in combination with a supported payload mass. Typical supported payload weights are in the range of 1000 pounds per piezoelectric motor. A typical piezoelectric motor element will have a spring stiffness coefficient of approximately 1.5 million pounds per inch. This gives a troublesome system resonance frequency of about 130 cycles per second. The value of this system resonance frequency (relative to the frequency range in which isolation is required) leads to two problems which must be alleviated to obtain a practical active isolation design. The first problem is that the system feedback loop gain must be quite high to obtain active vibration isolation down to approximately 1 hertz. Further, the gain must be filtered to lower the gain below unity at the payload/motor resonance frequency to ensure stability. In prior art designs, this desired gain has been impossible to obtain. Second, the system greatly amplifies environmental vibration at the payload/motor resonance frequency and since feedback gain at this frequency is low, most of the benefit of the active isolation system is lost in such a design. The need therefore continues to exist for a practicable active vibration isolation system based on piezoelectric motors or other stiff actuators.

SUMMARY OF THE INVENTION

The present invention solves the prior art problems by employing a small intermediate mass in its active vibration isolation system, distinct and elastically decoupled from the payload mass. The small mass is at least one order of magnitude smaller than the payload mass. At least one stiff actuator, such as a piezoelectric motor element, has a first surface coupled to the small mass and a second surface coupled to a source of vibration, such as the floor or an external case. A passive isolator element, such as an elastomeric cup shaped isolator, couples the payload to the small mass. A sensor is coupled to the small mass and generates a sensor signal which is a function of the movement of the small mass.

Circuitry receives the motion sensor signal and includes compensation circuitry such that the system will be stable over a predetermined range of vibration frequencies and payload masses. The circuitry further includes drive circuitry that is coupled to the stiff actuator for varying the length of the stiff actuator as a function of the altered sensor signal.

Preferably, the small mass is isolated from vibration in each of the "X", "Y" and "Z" axes. In a preferred embodiment, the small mass is housed within a case, and is suspended from the case in each of the "X", "Y" and "Z" axes by at least one stiff actuator in each direction. In the instance where the stiff actuators are piezoelectric motor elements, the horizontally disposed stiff actuators are precompressed in order to avoid damage to the motor elements from tensile stress. In a preferred design, each horizontal or radial piezoelectric motor element is placed between the small mass and a sidewall of the case on one side, and a compression assembly is placed on the other side of the small mass so as to exert compressive force from the case through the small mass to the piezoelectric motor element.

According to another aspect of the invention, each of the stiff actuators is coupled to the small mass or to the case using a shear decoupler that limits the exertion of shear stresses on the piezoelectric motors. In a preferred embodiment, each of the shear decoupler assemblies includes a first stiff plate or element adjoining an end of the piezoelectric motor element, a second stiff plate or element which adjoins the small mass or case, and a thin disk or wafer of elastomeric material between the stiff plates.

According to a further aspect of the invention, an additional compensation circuit can be employed which uses signals that are derived from a sensor mounted on the payload mass. These signals, which are representative of payload inertial velocity, are combined with the filtered velocity signals from the sensor on the small mass itself to provide further control of the payload vibration response.

In a preferred embodiment, the small mass motion sensors employed in the invention are geophones, which are chosen for their simplicity of design and beneficial mechanical dynamics.

The present invention also preferably uses a novel notch filter as a portion of the compensation circuitry for suppressing a certain resonant frequency between the passive isolator and small mass and motor spring stiffness without increasing the gain of the compensation circuit. Other compensation circuits in the circuitry are used to compensate for other resonating modes.

The present invention offers, for the first time, a practical active vibration isolation system based on stiff actuators and a move-out-of-the-way isolation scheme. Due to its provision of a small mass for increasing the value of the resonating frequencies, its provision of a passive isolator for decoupling the payload resonances from the small mass and also for providing passive isolation outside of the active isolation frequency range, and its provision of compensation circuitry for controlling the stiff actuators based on signals of absolute velocity from the small mass and optionally based on motion signals from the payload, the present invention is able to reduce vibration experienced by the payload mass from environmental sources without risk of feedback instability.

BRIEF DESCRIPTION OF THE DRAWINGS

Other aspects of the invention and their advantages will be discerned from the following detailed description, in which like characters identify like parts and in which:

FIG. 9 is a schematic elevational sectional view taken substantially along line 9—9 of FIG. 7;

FIG. 10 is an exploded isometric view of a second physical embodiment of the invention;

FIG. 10a is an illustration of a Cartesian coordinate system used in describing FIGS. 10 and 11;

FIG. 11 is an isometric view of the second embodiment of the invention in an assembled condition;

DETAILED DESCRIPTION OF THE ILLUSTRATED EMBODIMENTS

Figure 1:
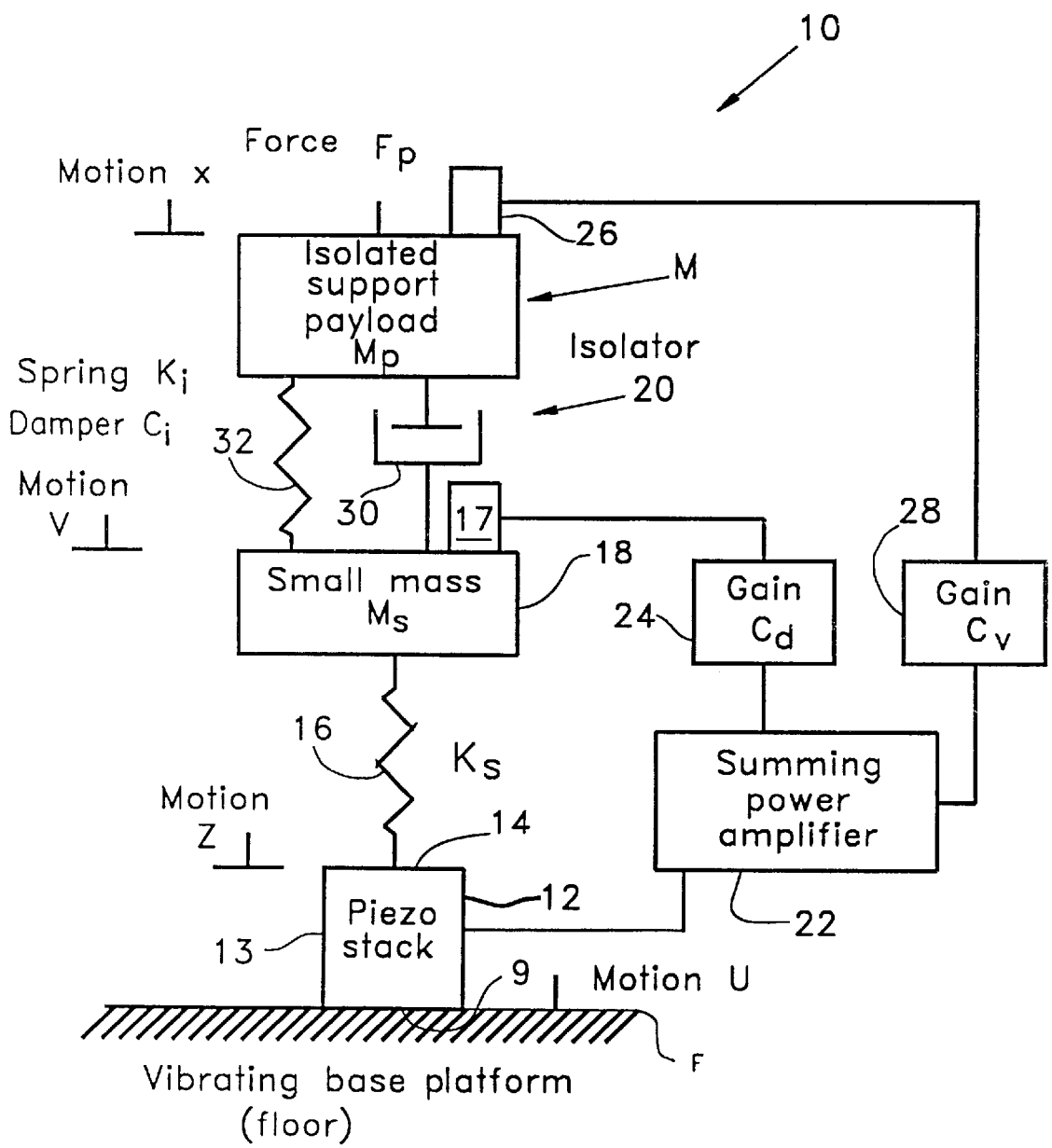
FIG. 1 is a schematic diagram of a system model showing vibration isolation along a single axis.

FIG. 1 is a schematic model of a passive/active isolation system indicated generally at 10. FIG. 1 shows a model which only considers active vibration in one of three dimensions; this simplification has been made for the purpose of explanation. System 10 may be termed a move-out-of-the-way active vibration isolation system. In this system, the floor or base F vibrates with a bottom 9 of a stiff actuator element indicated generally at 12. A top 14 of the stiff actuator 12 remains nearly motionless or approximately so with the objective of a motion that is 0.01 times the movement of floor F. The model of FIG. 1 isolates base or floor vibration only along the axis of sensitivity of an absolute displacement sensor 17 (potentially an absolute velocity sensor, such as a geophone, having its sensor signal output integrated to obtain displacement), which is parallel to the axis of displacement of actuator 12. The stiff actuator or motor element 12, which for example can be a piezoelectric stack, includes two discrete elements in this model. The first element is a totally rigid element called a stack 13 having a length parallel to its axis which is variable as a function of a control signal applied thereto. The other modelled element of the actuator motor 12 is a motor spring 16 having a stiffness $K_s$. This represents the spring stiffness of the actuator 12. In a preferred embodiment using piezoelectric motors, the spring stiffness is about 1.9 million pounds per inch, and the displacement-to-voltage relationship is about 1 million volts per inch peak.

A preferred piezoelectric stack 13 has a maximum relative stack displacement of 0.001 inches peak, and thereby requires a voltage of about 500 volts to move the motor 12 by plus or minus 0.005 inches. The voltage is arranged such that for no movement, 500 volts DC is applied to the piezoelectric motor 12. This bias voltage requires zero current and preextends the motor 12 through half of its maximum relative displacement. Raising or lowering the voltage causes the piezoelectric motor 12 to expand or contract accordingly. Piezoelectric motor 12 reaches its fully contracted state at zero volts and reaches its fully extended state at 1000 volts. The expansion and contraction with respect to applied voltage is nearly linear.

The system 10 is designed to support the weight of a payload mass $M_p$. In the model, the payload mass $M_p$ is chosen as 2.6 lbs/in/sec$^2$ which has a weight of 1000 pounds. $M_p$ is about this amount in the illustrated embodiment for each piezoelectric motor 12 later described in conjunction with structural embodiments. The resonance frequency for this system may therefore be derived; if the supported payload $M_p$ were supported directly by the stiff actuator 12, the system resonance frequency would be approximately 130 cycles per second. This in turn causes two problems. The first is that the system gain must be quite high to obtain the desired vibration isolation; on the other hand, the gain must be filtered to reduce the gain well below unity at the payload/motor resonance frequency $F_n$ (130 cycles per second). The entire loop gain from stiff actuator 12 input to compensated velocity signal output 20 must be high, such as 99. This desired gain would be impossible to obtain at frequencies lower than $F_n$. Secondly, without correction the system amplifies vibration greatly at the payload/motor resonance frequency and most of the benefit of the vibration isolation is lost.

The present invention removes this problem by interposing a small mass 18 having a value $M_s$. Mass $M_s$ should be at least one order of magnitude smaller than the range of masses $M_p$ which the system 10 is designed to support or isolate and the ratio of $M_s$ to $M_p$ should preferably be in the range of 1/50 to 1/200. In the illustrated embodiment, $M_p$ is chosen to correspond to 10 pounds where $M_p$ corresponds to about 1000 pounds.

The small mass 18 is placed directly on the stiff actuator 12. This makes the resonance associated with the piezoelectric motor spring coefficient $K_s$ very high, near 1000 cycles per second. With small mass 18 weighing approximately 10 pounds, the resonance frequency of the small mass and piezoelectric motor 12 is about 1000 cycles per second. Then, an elastomeric passive vibration isolator indicated at 20 is interposed between the small mass 18 and the payload mass $M_p$. The isolator 20 has a damper element coefficient $C_i$ schematically illustrated at 30, and a spring constant $K_i$ which is schematically illustrated at 32. This arrangement permits the feedback gain at very high frequencies, because the passive isolator 20 provides passive vibration isolation at those very high frequencies. The passive isolator 20 is selected to give a resonance frequency when loaded with the payload mass $M_p$ of about 20 cycles per second.

The system controls the expansion and contraction of the stiff actuator 12 through a summing power amplifier 22. Summing power amplifier 22 applies a variable voltage to the piezoelectric motor 12, with 500 volts DC being applied to motor 12 in a steady state condition. The small mass velocity sensor 17 generates a signal which is integrated to obtain the absolute displacement of the small mass 18. A sensor signal is communicated from the sensor 17 to a gain module 24, which integrates the signal to obtain displacement and boosts gain. The amplified displacement sensor signal is communicated to the power amplifier 22, which contains numerous compensation circuits as will be detailed below.

Most of the supported payloads $M_p$ isolated with the active vibration isolation system 10 have moving mechanical components which generate forces that act on the payload $M_p$ and cause it to vibrate in response. It may therefore be desirable to have the isolation system 10 resist supported payload movement due to payload-induced forces. To enhance the passive properties of system 10, a second motion sensor 26 is added to the active vibration isolation system 10. The payload mass absolute motion sensor 26, which can be an absolute velocity sensor or a relative displacement sensor, generates a signal which is amplified at gain stage 28. The amplified signal is then summed with the condition signal from sensor 17 such that the input to stage 22 is dependent on sensor 17 and sensor 26. Taking both the absolute payload mass velocity loop and the absolute small mass displacement loop into account, the force summation around the isolated supported payload mass $M_p$:

$$M_p S^2 X(S) = (K_i + C_i S)(V(S) - X(S)) + F_p \quad (1)$$

The above equation is presented in Laplace notation. X is the motion of the isolated supported payload in $M_p$. $F_p$ is the force acting on the payload $M_p$, typically the force of gravity. V is the motion of the small mass 18.

The small mass $M_s$ is acted upon by the isolator spring $K_i$ and the isolator damper 30, as well as the piezoelectric motor spring element 16 ($K_s$. The force summation equation around small mass 18 is presented below.

$$M_s S^2 V(S) = K_s(Z(S) - V(S)) + (K_i + C_i S)(X(S) - V(S)) \quad (2)$$

Let U equal the motion of floor F in the axial direction of motor spring $K_s$. Let motion Z equal the motion of the top of the piezoelectric stack 14. The absolute velocity feedback equation may then be written as follows:

$$Z - U = -C_d V(S) - C_v S X(S) \quad (3)$$

In the above equation, $C_d$ is the gain from the absolute displacement sensor feedback loop and $C_v$ is the gain from the absolute velocity sensor feedback loop.

Figure 2:
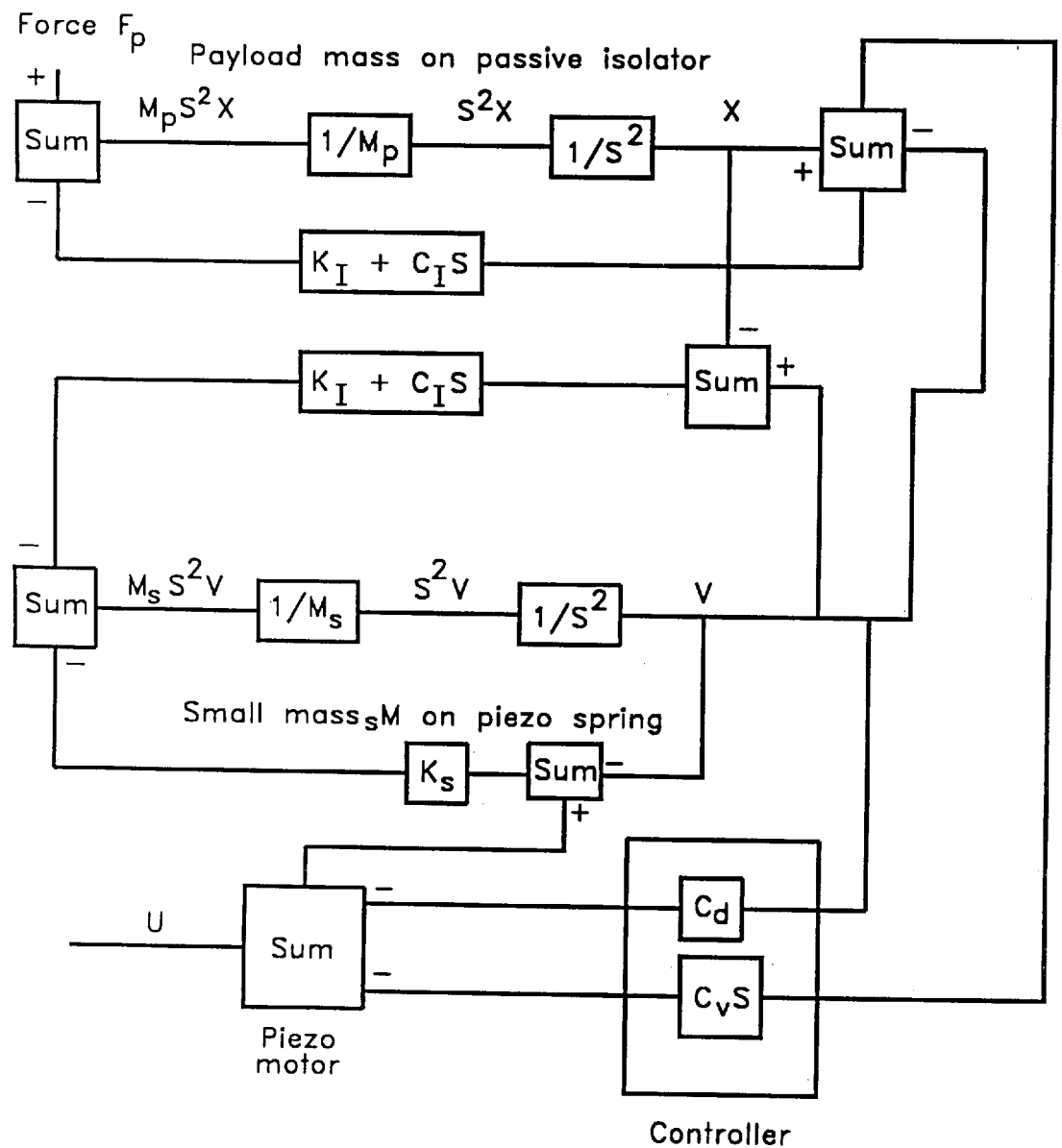
FIG. 2 is a mathematical system block diagram showing how differing sections of the active vibration isolation system mathematically interrelate with each other.

The global system operation is not presented as a complete transfer function since this is a differential equation that is too complex to be of any value. Instead, the system block diagram is shown in FIG. 2. FIG. 2 is a Laplace transform block diagram showing how different sections of the complete active vibration isolation system interrelate with each other.

Figure 3A:
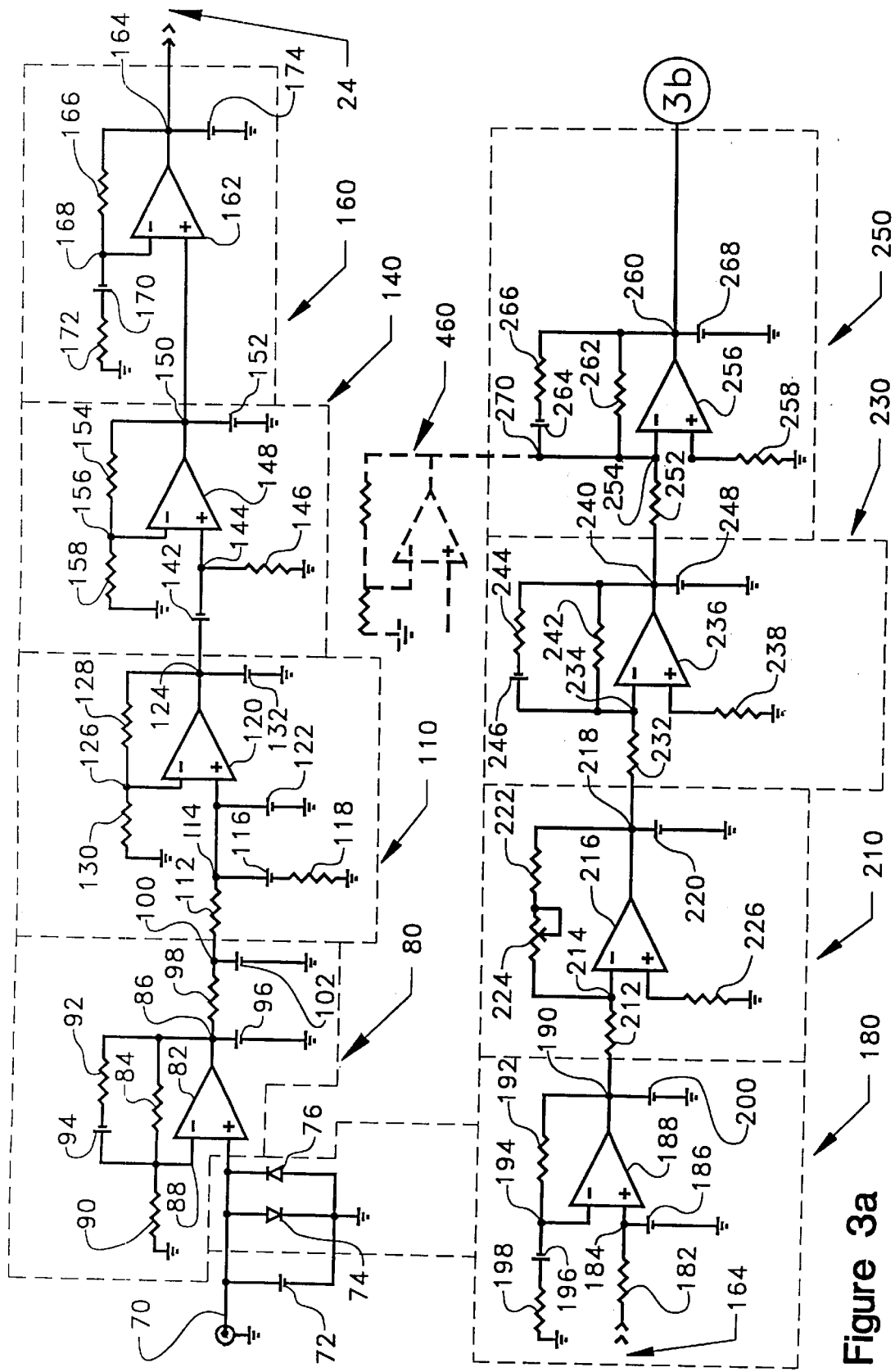
FIGS. 3a and 3b are a detailed electronic circuit diagram of compensation circuitry linking a sensor of the invention to controlled stiff actuator elements.
Figure 3B:
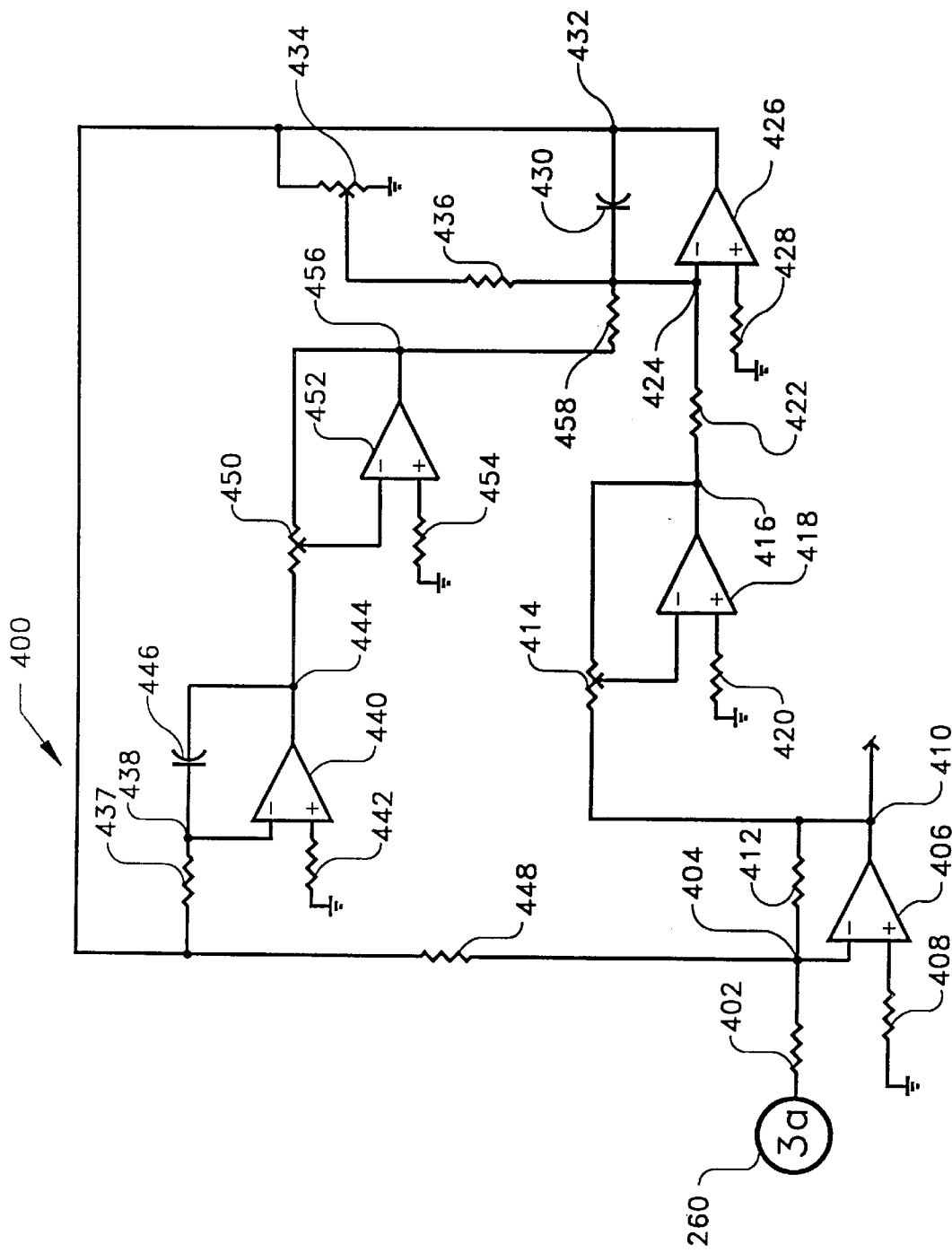

Returning momentarily to FIG. 1, box 24 represents the compensation and gain circuitry interposed between the absolute velocity sensor 17 and the power amplifier 22. Sensor 17 may be a servo-accelerometer or, preferably, a geophone. The geophone consists of a coil of wire supported on very low stiffness mechanical springs with a magnetic field passing through the coil. The magnetic field induces a voltage in the coil which is proportional to the relative velocity of the coil with respect to the geophone case holding the magnet, the strength in the magnetic field passing through the coil, and the number of turns of wire within the coil. The geophone also has low cost, low noise and high sensitivity. The compensation circuitry 24 (and a portion of summing power amplifier 22) is shown for the case where sensor 17 is a geophone and is illustrated in detail in FIGS. 3a and 3b, which is a schematic electrical diagram of various compensation stages. FIG. 3a illustrates an analog embodiment of compensation circuitry 24; it is also possible to use digital circuitry and digital signal processing to accomplish the same functions as the analog circuitry illustrated.

The geophone output appears at input 70. The signal appearing at input 70 is a voltage signal that is related to the displacement of the small mass as follows:

$$E_{out} = C_g * \frac{S^3}{(S + W_g)^2} * (\text{CASE DISPLACEMENT}) \quad (4)$$

In this equation, $C_g$ is the motor constant of the geophone, measured in volts per inch per second. $W_g$ is the resonance frequency of the geophone coil on its suspension springs. The case displacement is that of the geophone case, which is affixed to the small mass 18. The factored characteristic equation of the geophone indicates that the damping acting on the geophone coil mass and spring system is critical. The output appearing on compensation circuitry input 70 is a measurement of the absolute velocity of the geophone case as weighted by the above transfer function. It is however not essential that the damping applied to the coil mass spring system be exactly critical, and a fraction of critical damping of the geophone response from about 0.7 to about 2.0 will meet the needs of the active vibration isolation system sensor according to the invention.

The integrator stage 80 (otherwise known as an integration lag network) should be placed prior to any analog to digital convertor (in turn placed before digital circuitry) because the unintegrated velocity signal contains large, high frequency amplitudes making the small, very low frequency vibration amplitudes many decibels below the average (RMS) signal level. The operation of the integrator stage 80 on the input signal 70 can be expressed as follows:

$$\frac{\text{Gain}}{1 + T_i S} \quad (5)$$

In the above equation, expression, $T_i$ equals $R_i C$ where $R_i$ is the equivalent series resistance of stage 80, and $C_i$ is the equivalent capacitance to ground after the resistance but before the output.

To stabilize the active vibration isolation system, the geophone provides an inherent low-frequency gain rolloff by virtue of its transfer function (equation 4 above) with a resonance frequency of 4.5 hertz. Without this low-frequency rolloff characteristic inherent in geophones, at least two additional stages of compensation would need to be added to the compensation circuitry 24.

A small capacitor 72, such as 0.01 µF, is connected between input 70 and ground. Diodes 74 and 76 are connected between the input 70 and ground as preamplifier overvoltage protection.

The compensation circuitry 24 is organized into several successive stages which are illustrated by dashed enclosures. The first stage 80 is designed to integrate the velocity signal appearing on input 70 to obtain the displacement signal of the small mass 18 (FIG. 1) and also to provide a very substantial gain, here chosen as 15,000. This is done with the aid of a noninverting operational amplifier 82, which receives the geophone input 70 at its positive input. A feedback resistor 84 is connected between an output node 86 and a negative input 88 of the amplifier 82.

A noninverting amplifier is used so as not to load the geophone sensor 17. A resistor 90 is connected between node 88 and ground. To obtain a DC gain of 15,000, resistor 84 is chosen as 15 kΩ and resistor 90 is chosen as 1 Ω. A preferably 1 kΩ resistor 92 and a 220 µF capacitor 94 are connected in series between nodes 86 and 88. A low-value capacitor 96, which for example may be 100 pF, connects node 86 to ground.

A further resistor 98 connects node 86 to a node 100, which serves as the output of stage 80. A capacitor 102 is connected between node 100 and ground, and is chosen in the illustrated embodiment as 220 µF.

Half of the integration is done by the op amp 82. The rest of the integration performed by stage 80 is done by a combination of resistor 98 and capacitor 102. It is preferred to have as much amplification of the signal at this stage 80 as possible, so that DC offset voltages and flickers are not amplified in later stages.

In alternative, mostly digital designs, it is still preferred to have an initial analog stage 80. This boosts the signal from microvolts to volts, such that there will be a high enough voltage in the signal for analog to digital convertors to read. The remaining stages of the compensation circuitry shown in FIG. 3 can be digital, and for example can take place as a succession of programmed steps in a digital signal processor.

Node 100 serves as the input to a second stage 110. Stage 110 is a low frequency compensation stage that takes into account the preferred use of a geophone for the absolute displacement sensor 17.

To achieve a robust unity gain cross-over at a targeted frequency of 0.2 cycles per second, the rate of change of the open loop gain must be 6 dB per octave in the 0.2 hertz frequency region. To do this, a lag-lead network may be employed. The lag-lead network 110 has unity gain at low frequencies, then goes into a negative 6 dB per octave attenuation due to the lag part of the circuit, and finally levels off to a constant gain which is less than unity at a higher frequency due to the lead portion of the circuit. The low frequency compensation function of stage 110 can be expressed as follows:

$$E_{out} = \frac{1 + T_{c2}S}{1 + T_{c1}S} * E_{in} \quad (6)$$

In stage 110 (FIG. 3), a capacitor 116 connects node 114 to a resistor 118. Resistor 118 is connected between capacitor 116 and ground. Resistor 112, capacitor 116 and resistor 118 form the lag-lead circuit components. In equation (6), $T_{C2}=R_{118}C_{116}$, and $T_{C1}=(R_{112}+R_{118})C_{116}$. In the illustrated embodiment, resistor 112 is chosen as 14 kΩ, capacitor 116 is chosen as 220 µF, and resistor 118 is chosen as 720 Ω.

Node 114 is connected to a positive input of an operational amplifier 120. Node 114 is also connected via a 2200 pF capacitor 122 to ground. This capacitor eliminates noise. An output node 124 of the op amp 120 is connected back to a negative input 126 through a resistor 128 which in the illustrated embodiment is chosen as 15 kΩ. A resistor 130 connects node 126 to ground.

The DC gain of stage 110 is equivalent to the value of resistor 128 divided by the value of resistor 130, plus one. Where, as in the illustrated embodiment, resistor 130 is chosen as 681 Ω, the DC gain is 23. The stage 110 departs from the ideal low frequency compensation given in equation (6) because of an interaction between capacitor 102 and capacitor 116; the approximation is nonetheless close.

A small capacitor 132 is preferably placed between node 124 and ground.

Stage 140 is a DC voltage block stage having a gain of 6. From its input at node 124, a preferably 220 µF capacitor 142 is connected to a node 144, which is connected via a resistor 146 to ground. Node 144 serves as a positive input to an operational amplifier 148. An output node 150 is connected to ground through a relatively small (100 pF) capacitor 152. A feedback resistor 154 connects the output node 150 to the negative input of the op amp 148 (node 156). A resistor 158 connects node 156 to ground.

A combination of capacitor 142 (preferably 220 µF) and resistor 146 (preferably 15 kΩ) provides the DC blocking action. In an embodiment (not shown) wherein stages 110, 160, 180, 210, 230 and 250 are digital, the DC voltage blocking lead network 140 is preferred to be placed prior to any analog/digital convertor (not shown) to insure a full dynamic range for the computer input. In the illustrated, straight-analog embodiment, placing the DC voltage block stage 140 after the velocity integration and amplification stage 80 insures that the DC voltage block will occur after the half-gain point in the compensation circuit.

Stages 160 and 180 are designed to add phase lead in the frequency region of the resonance of the passive isolator or cup mount (FIG. 1). Node 150 is connected to a positive input of an amplifier 162. An output node 164 of the amplifier 162 is connected through a preferably 100 kΩ resistor 166 to a node 168. The node 168 is connected to a negative input of the op amp 162. A capacitor 170 (preferably 0.39 µF) and a second resistor 172 (preferably 100 kΩ) connect the node 168 to ground. A small (100 pF) capacitor 174 connects node 164 to ground.

Stage 160 will produce a zero at a time constant of $C_{170} R_{166}$, or approximately 0.039 seconds. Stage 160 will further produce a pole at $$C_{170} * \frac{(R_{166}R_{172})}{(R_{166} + R_{172})},$$

or about 0.0195 seconds. In place of the real pole and real zero produced by stage 160, alternative circuitry can be provided which will produce a complex pole and a complex zero.

In succeeding stage 180, node 164 is connected via a resistor 182 to a node 184, which is connected via a 0.001 µF capacitor 186 to ground and also to the positive input of an op amp 188. An output node 190 of the op amp 188 is connected through a resistor 192 to a negative input node 194. The node 194 is connected through a capacitor 196 and a resistor 198 in series to ground. A relatively small (100 pF) capacitor 200 connects node 190 to ground. Resistors 192 and 198 are preferably chosen as 100 kΩ while capacitor 196 is chosen as 0.39 μF. Resistor 182 may be chosen to be 33.2 kΩ, while capacitor 186 may be chosen as 0.001 μF. Resistor 182 and capacitor 186 coact to provide a noise reduction filter at high frequencies. Similar to stage 160, stage 180 creates another pole and another zero at the same respective time constants.

Both stages 160 and 180 have a DC gain of 1, but a high frequency gain of about 2 because of capacitors 170 and 196. Two of the stages 160 and 180 are used together in order to provide more phase shift, in an amount of 45 to 50 degrees all told.

Stage 210 is a 1-to-10 gain adjust stage. A resistor 212 connects the output of stage 180 to a node 214, which serves as the negative input of an op amp 216. An output node of the op amp 216 is connected to ground by a relatively small (e.g., 100 pF) capacitor 220. Node 218 is connected via resistor 222 to a variable resistor 224, which can be adjusted between 0 and 50 kΩ. Resistor 222 has a preferred value of 5 kΩ. A resistor 226 connects a positive input of the op amp 216 to ground; this resistor preferably has a value of 1 kΩ. To minimize the effect of input offset currents, the impedance of resistor 226 is chosen to be roughly the same as the feedback impedance of op amp 216.

Succeeding stages 230 and 250 are inserted into the compensation circuit to lower the gain in the high frequency region. The reason for this is as follows. Above the frequency where $T_{C2}$ operates (approximately 0.5 cycles per second), the gain of the open loop transfer function of circuitry 24 increases at a rate of 12 dB per octave until the geophone resonance frequency is reached at about 4.5 cycles per second. Above this frequency, the open loop transfer function gain increases until it levels off at a constant loop gain of approximately 100. If allowed to do so, and if the mechanical components of the active vibration isolation system of the invention were completely ideal and rigid, the open loop gain would remain at 100 to very high frequencies.

However, at high frequencies there are resonances in the small mass 18 (see FIG. 1) around 2000 hertz and the resonance of the piezoelectric motor spring element 16 and small mass exists at about 700 hertz. Other high frequency resonances exist as well in the geophone 17 and in the system platform base (described below). If the open loop gain were allowed to remain at a constant magnitude of 100 in the frequency regions of these resonances, an unstable state would exist, causing the system to oscillate at or near one of the above resonances.

Therefore, the high frequency loop gain of compensation circuitry 24 must be well below unity before the lowest frequency of the above resonances, which in this case is the resonance of the small mass 18 and the spring element 16 at about 700 cycles per second. Allowing for some amplification at the high frequency resonances, the loop gain must cross unity and drop at a fast rate with respect to increasing frequency well before 700 hertz.

Preferably, unity gain should be achieved at approximately 350 cycles per second with a fast dropoff thereafter. The expression for the high frequency gain reduction is as follows:

$$\frac{1}{(1+T_{c3}S)} \qquad (7)$$

$T_{C3}$ as chosen is 0.00314 seconds. The effect of stages 230 and 250 together is to lower the open loop gain starting at 50 cycles per second, with a fall off of a rate −12 dB per octave.

In the illustrated analog stage 230, a resistor 232 connects the output node 218 of stage 210 to an input node 234 of an operational amplifier 236. A second input of the op amp 236 is connected via a resistor 238 to ground; resistor 238 is preferably 100 kΩ. An output node 240 of the op amp 236 is connected back to the input node 234 via a resistor 242. Node 240 is connected to node 234 also via a resistor 244 in series with a capacitor 246. A relatively small capacitor (100 pF) 248 connects the output node 240 to ground. Preferably, capacitor 246 is chosen to be 0.22 μF, resistor 244 is chosen as 1700 Ω, and resistor 242 is chosen as 100 kΩ. This combination yields a pole at 0.022 seconds, and a zero at $3.74 \times 10^{-4}$ seconds.

The components of stage 250 are in general similar to the components in stage 230. A resistor 252 connects the output node 240 of stage 230 with an input node 254 of an operational amplifier 256. A second input of the op amp 256 is connected via a resistor 258 to ground. An output node 260 of the op amp 256 is connected via a resistor 262 to the input node 254. Nodes 260 and 254 are also interconnected in series via a capacitor 264 and a resistor 266. The preferred values of resistors 252, 258, 262 and 266, and of capacitor 264, are the same as the corresponding resistors and capacitors in stage 230. A small capacitor 268 (100 pF) connects output node 260 to ground. The second stage squares the term to $$\left(\frac{1}{1+T_{c3}S}\right)^2$$

to obtain the desired compensation function.

In the illustrated embodiments, it has been discovered that a resonating mode exists at approximately 300 hertz in the radial directions and 700 Hz in the Z direction between the small mass 18 and the payload mass M because of the stiffness of the cup mount or passive isolator 20 and the stiffness of the piezoelectric motors. This vibrational mode is suppressed by the "notch filter" indicated generally at 400 on FIG. 3b.

A preferably 10 kΩ resistor 402 connects node 260 to a node 404, which acts as a negative input to an operational amplifier 406. A preferably 10 kΩ resistor 408 connects a positive input of op amp 406 to ground. An output 410 of the op amp 406 is connected back to the input node 404 via a preferably 10 kΩ resistor 412. Because of the values of resistors 402 and 412, the gain of the "mother" amplifier stage 406 is close to 1. Node 410 acts as the output node of the entire stage 400, and is attached to the piezoelectric motor power amplifier represented at 22 in FIG. 1.

The remaining circuitry of stage 400 is bridged across input node 404 and output node 410. A potentiometer 414 has a first end connected to the node 410, a second end connected to a node 416, and a wiper connected to a negative input of an op amp 418. A preferably 10 kΩ resistor 420 connects a positive input of the op amp 418 to ground. The purpose of op amp 418 and components 414 and 420 is to set the gain of the signal which is fed around the loop in parallel to resistor 412.

A resistor 422, which also is preferably 10 kΩ, connects node 416 to an input node 424. Input node 424 is connected to a negative input of an operational amplifier 426. A preferably 1 kΩ resistor 428 connects a positive input of the op amp 426 to ground. A capacitor 430, herein preferred to be 0.047 μF, connects an output node 432 of the op amp 426 to input 424 thereof. Nodes 432 and 424 are also connected via a preferably 5 kΩ potentiometer 434 and resistor 436, which preferably has a 1 kΩ value. The wiper of potentiometer 434 is connected via resistor 436 to node 424, while one end thereof is connected to ground while the other end thereof is connected to node 432. Operational amplifier 426 and associated components 428, 430, 436 and 434 form a first integrator stage. The potentiometer 434 sets the depth of the "notch" in the output spectrum appearing at node 410.

Node 432 is connected via a preferably 10 kΩ resistor 437 to a node 438, which serves as a negative input to an operational amplifier 440. Op amp 440 has a positive input thereof connected to ground via a preferably 1 kΩ resistor 442. An output node 444 of the op amp 440 is connected to input node 438 via a capacitor 446, which in the illustrated embodiment is preferred to be 0.047 μF. Op amp 440 and associated components 442, 437 and 446 form a second integrator stage which, in combination with the first integrator stage including op amp 426, will produce a resonating condition. The voltage at output node 432 will resonate in a predetermined frequency range, and will produce an overall reduction in the gain caused by mother amplifier 406. Node 432 is connected back to the signal input 404 of op amp 406 via a resistor 448, which in the illustrated embodiment is preferred to be 4.99 kΩ.

Node 444 is connected to one end of a potentiometer 450. A wiper of the potentiometer 450 is connected to a negative input of an operational amplifier 452. A positive input of this op amp 452 is connected via a resistor 454 to ground. In the illustrated embodiment, potentiometer 450 is chosen as 5 kΩ, and resistor 454 is chosen as 1 kΩ.

The other end of potentiometer 450 is connected to an output node 456 of the op amp 452. The op amp 452 and associated components 450 and 454 act as an inverting amplifier with gain. As the potentiometer 450 is adjusted, the frequency of the "notch" appearing at output 410 changes. The higher the gain in the quadratic loop between nodes 404 and 410, the higher the width of the "notch." Node 456 is connected via a preferably 10 kΩ resistor 458 to node 424.

The notch filter stage 400 has the advantageous feature of a gain which never goes above 1. The DC gain is 1, while the gain at an infinite frequency is also 1. The frequency of the "notch" is adjusted by potentiometer 450. The depth of the "notch" is adjusted at potentiometer 434. The width of the "notch" is adjusted at potentiometer 414.

In the embodiment illustrated in FIGS. 6–13, a payload absolute velocity sensor, such as a geophone 26 (FIG. 1), is used to provide an additional feedback loop to the piezoelectric stack 12. If this additional sensor is employed, a compensated signal from it is added at node 270. A payload velocity signal amplifier stage is shown in phantom at 460(FIG. 3a.

The closed loop equation of motion for this optional absolute velocity loop may be expressed as follows:

$$\frac{X}{U} = \frac{W_i^2}{S^2 + G_v C_v W_i^2 S + W_i^2} \qquad (8)$$

where X is the motion of the payload $M_p$, U is the motion of the base, $W_i$ is the resonant frequency of the passive isolator and payload, $G_v$ is the compensation function, $C_v$ is the closed loop gain and S is the Laplace transform operator. The above equation is shown in a simplified form setting the transfer function of the geophone to unity. This can be done because the resonance frequency $W_g$ of the geophone is almost a decade below the frequency region where the active absolute velocity control is active.

The imaginary part of the transfer function characteristic equation must be equal to $2\zeta W_i S$, where $\zeta$ is the passive isolator fraction of critical damping. The compensation function $G_v$ is the passive isolator fraction of critical damping. The compensation function $G_v$ is set to unity. Zeta can then be found as follows:

$$\zeta = 0.5 C_v W_i \qquad (9)$$

The passive isolator is preferably of elastomeric construction. Since the desired value for $\zeta$ is unity, and since $W_i$ for elastomers under the stresses imposed by payload $M_p$ (in this embodiment, having a maximum value of 2000 pounds) is about 2π20 radians per second, $C_v$ is found to be about 0.01 lbs/inch/sec.

The voltage required to move the piezoelectric motor 0.0001 inches is 100 volts; the geophone calibration is 1.5 volts per inch per second. The physical gain necessary to achieve the desired loop gain is 100/1.5 or 67. With a gain of this small magnitude, no DC blocking stage is necessary.

The physical amplifier gain of 67 is achieved by stage 460 by selection of appropriate resistor values.

At the geophone resonance frequency of 4.5 cycles per second, the payload absolute velocity control open loop gain is 0.0015 and, at a frequency of 100 cycles per second, the open loop gain for the payload velocity control loop is 0.0033. Both of these gains are low and become even lower as the frequency increases or decreases from the passive isolator resonance frequency. The low gain stage at 4.5 hertz and 100 hertz indicates that there is no need for complex compensation circuitry to be inserted into the circuit from the payload absolute velocity sensor 26 to the power amplifier 22. Thus, all that may be necessary is a single amplifier stage 460. For payloads with complex and heavy internal resonances, more complicated filtering may be required in this feedback loop, such as the insertion of at least two poles.

The circuitry in FIG. 3 is entirely analog. The same signal modifications can be made digitally using any of several algorithms, and these digital methods should be considered to be the full equivalents of the analog circuitry illustrated, as it is well within the abilities of a person of ordinary skill in the art to implement these functions digitally.

The compensation circuit 24 is used to regulate signals from an "absolute displacement" sensor (preferably, an absolute velocity sensor having its output integrated once; circuit 24 as illustrated performs this integration) and (optionally) an absolute velocity sensor for one direction of motion. As will be described below, the system of the invention compensates for vibration in each of three directions. Compensation circuit 24 is simply replicated for each of these additional directions of vibration compensation. In an alternative embodiment (not shown) a multi-accessed coupled compensation circuit takes the place of individual compensation circuits.

Figure 4:
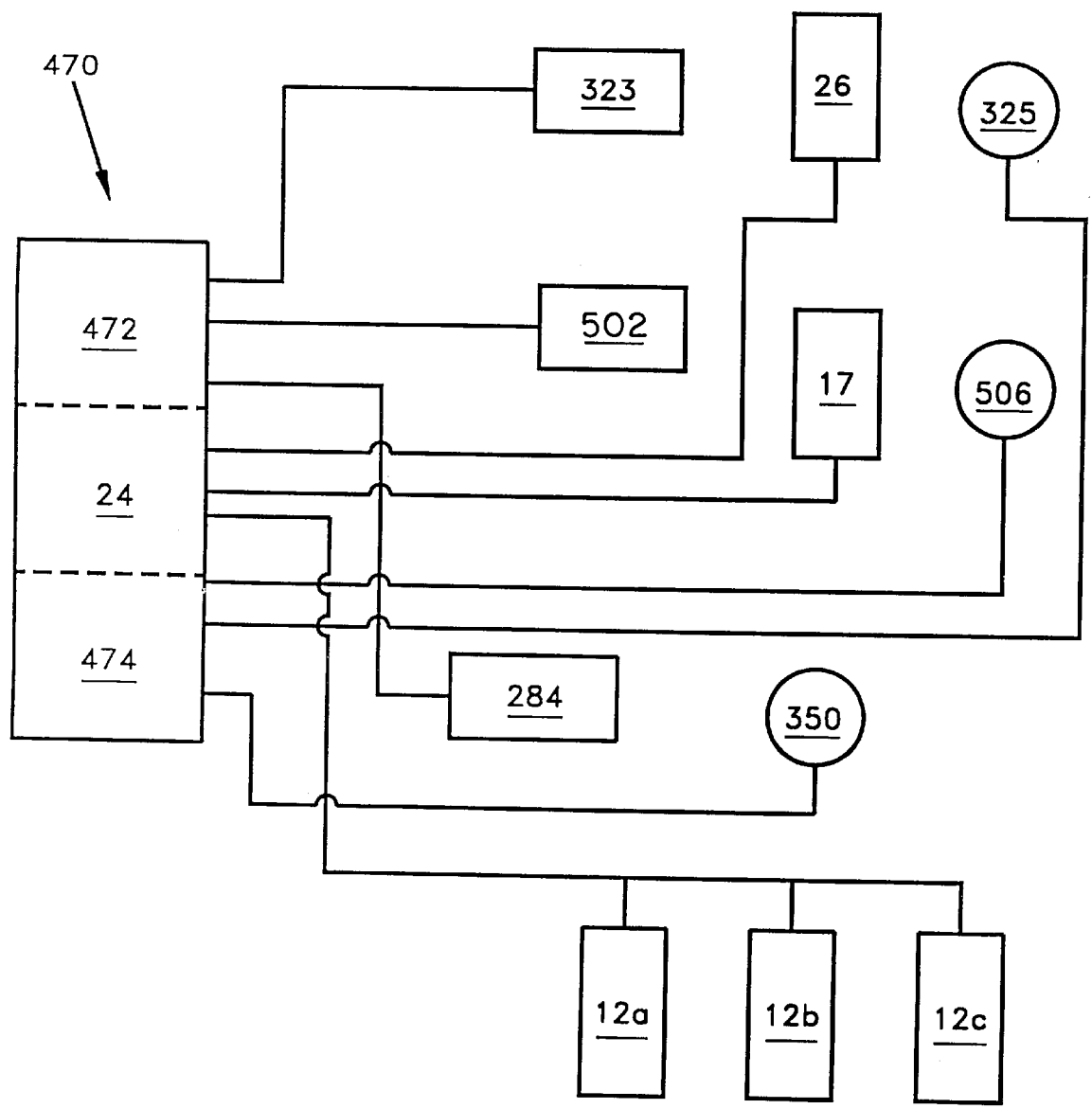
FIG. 4 is a high-level simplified electrical schematic diagram showing the electrical interconnections between sensors and stiff actuator elements in three dimensions of control.

FIG. 4 is a high-level electrical schematic diagram showing the electrical interconnections between the geophones, compensation circuitry and stiff actuators for a three-dimensional system. An electronic controller indicated generally at 470 includes compensation circuit 24, which has been more particularly described in FIG. 3. Circuits 472 and 474 are duplicates of circuit 24.

Compensation/control circuit 24 is provided to receive sensor inputs from the "Z" or vertical payload geophone 26 and the "Z" small mass geophone 17. It outputs control signals in parallel to each of a plurality of vertical piezoelectric or stiff actuator motors 12a, 12b and 12c. Compensation/control circuit 472 receives sensor signals from "X" geophone 323, which senses motion of the payload along the "X" axis. It also receives sensor signals from "X" geophone 502, which senses motion in the "X" direction of the small mass. A control signal is derived from these sensor signals and is transmitted to "X" radial stiff actuator or piezoelectric motor 284.

Compensation/control circuit 474 receives inputs from "Y" payload geophone 325 and "Y" small mass geophone 506. Based on the signal received from these geophones, the "Y" compensation/control circuit 474 sends a control signal to a "Y" radial stiff actuator or piezoelectric motor 350. As can be seen, the sensor/motor arrangement has no electronic crosstalk and the various shear decouplers described below obviate the need for handling physical crosstalk.

Figure 18:
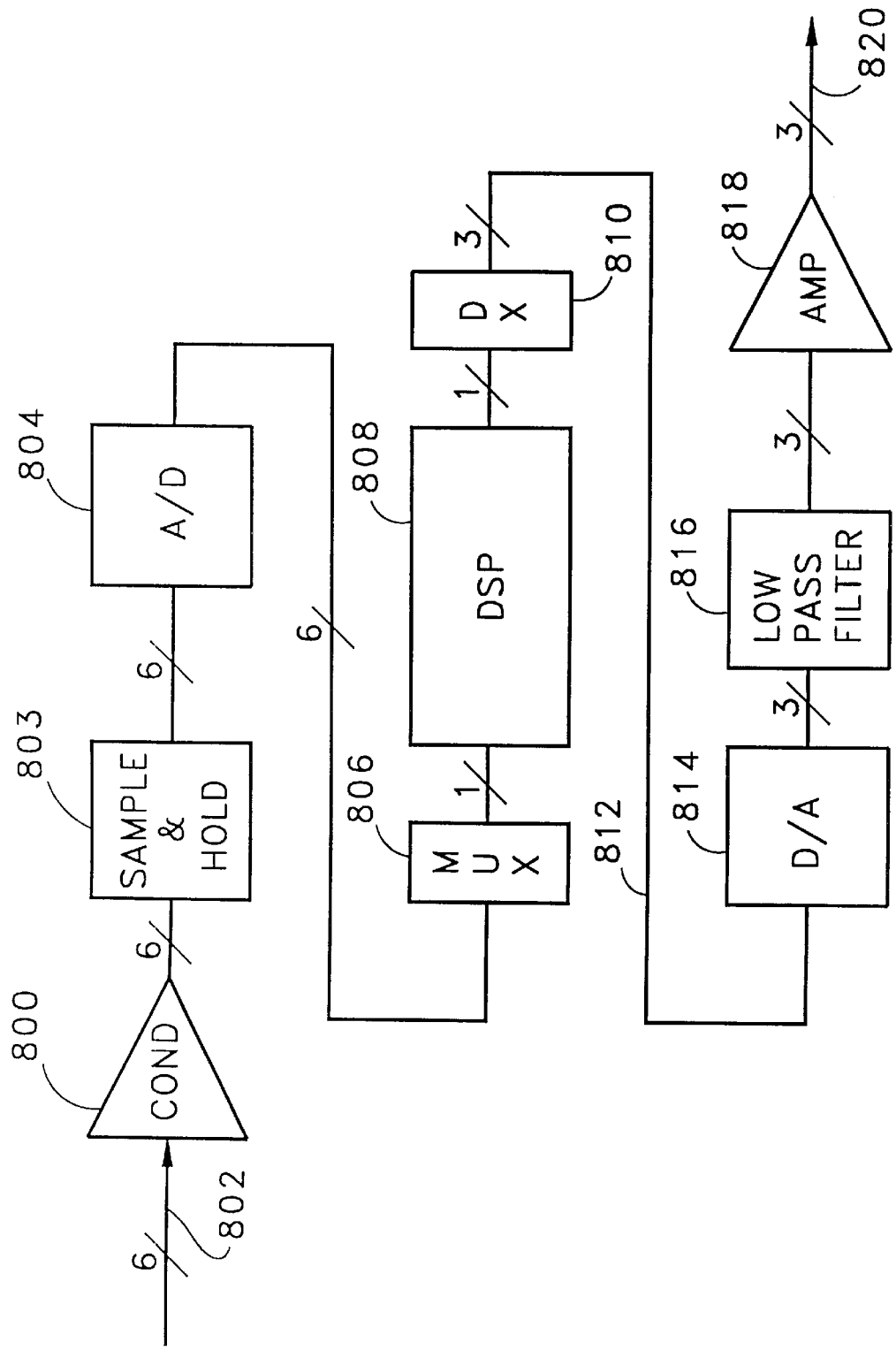
FIG. 18 is a high level schematic electrical block diagram showing digital circuitry suitable for performing the compensation functions described herein.

As previously discussed, the compensation circuitry of the present invention may be implemented in digital form in place of analog form. FIG. 18 is a high-level schematic electrical block diagram of digital compensation circuitry that can be used in place of the analog circuitry illustrated in FIG. 3. A signal conditioner 800 buffers and amplifies each of six sensor signals (two for each of the X, Y and Z directions) appearing on inputs 803. Three of the sensor signals come from the motion sensors adjoining the small mass; in the instance where an outer control loop is also used, another three sensor signals are derived from sensors associated with the payload mass. The signal conditioner 800 buffers and amplifies the signals, and then passes them to a sample and hold circuit 803. At appropriate intervals, the sample and hold signal sends the signals to an analog/digital converter 804. The analog/digital converter 804 sends digital signals to a multiplexer 806, which selects one of the six signals for transmission to a digital signal processor 808. In the illustrated embodiment, the digital signal processor processes one signal at a time; of course, parallel processing can also be used. The digital signal processor 808 performs the signal compensation necessary to filter the signals appearing on input 803 in order to derive appropriate control signals for the piezoelectric motors. A digital control signal for a selected one of three directions is output from the digital signal processor 808 to a demultiplexer 810, which in turn sends the demultiplexed signal on a selected one of three lines 812 to a digital to analog converter 814. Digital to analog converter 814 creates analog versions of the control signals, which are in turn passed to a low pass smoothing filter 816. The filtered control signals are then passed to a high voltage amplifier 818, which then communicates the amplified signals to the piezoelectric stacks via output 820.

Figure 19:
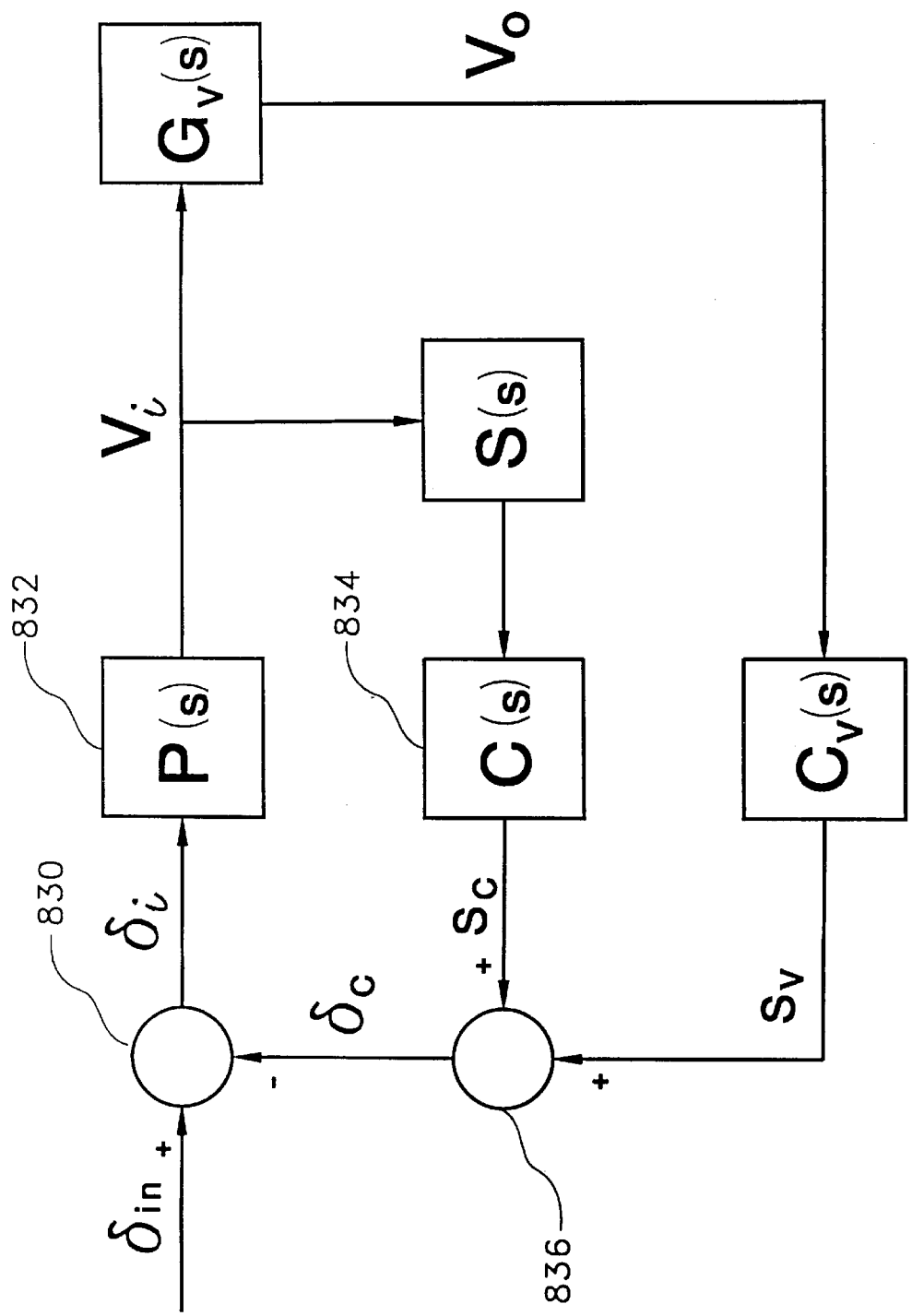
FIG. 19 is a representational block diagram of a compensation system using absolute velocity sensors in an outer control loop.

FIG. 19 is a block diagram representation of the combined inner and outer control loops which should be implemented by the structure and compensation circuitry of the active/passive vibration compensation system, only one of three directions being shown. FIG. 19 in particular illustrates the case where an outer loop is employed which uses the absolute velocity of the payload mass. The input function $\delta_{hd in}$ represents the base disturbance displacement which is caused by the vibrating floor. An inertial displacement $\delta_c$ is caused by the piezoelectric motor stack, and this is subtracted at node 830 from $\delta_{in}$ in a "move out of the way" fashion to obtain $\delta_i$, which is the intermediate mass inertial displacement. It is the objective of the invention to minimize $\delta_i$.

Block 832 represents a differentiation from displacement to velocity, and is inherent in the system structure. Block 832 produces $v_i$, which is the absolute velocity of the intermediate or small mass. The velocity $v_i$ sensed by the geophones. The geophone sensor dynamics are represented by function S(s).

Function $G_v(s)$ represents the dynamic relationship between the intermediate inertial velocity $v_i$ and a velocity output $v_o$ of the payload. This in turn is an input to $C_v(s)$, which is the outer loop compensation function. The inner loop compensation function C(s) is shown at block 834, and is implemented, for example, by the circuitry shown in FIG. 3. Function Cv(s) is used only to compensate for a resonance appearing at approximately 20 hertz that is caused by the cup mount or passive isolator. The output from the compensation circuitry Cv(s) is summed with the compensation signal from C(s) at node 836 in the illustrated embodiment, and this in turn produces the inertial displacement $\delta_c$ of the piezoelectric motor.

Figure 20A:
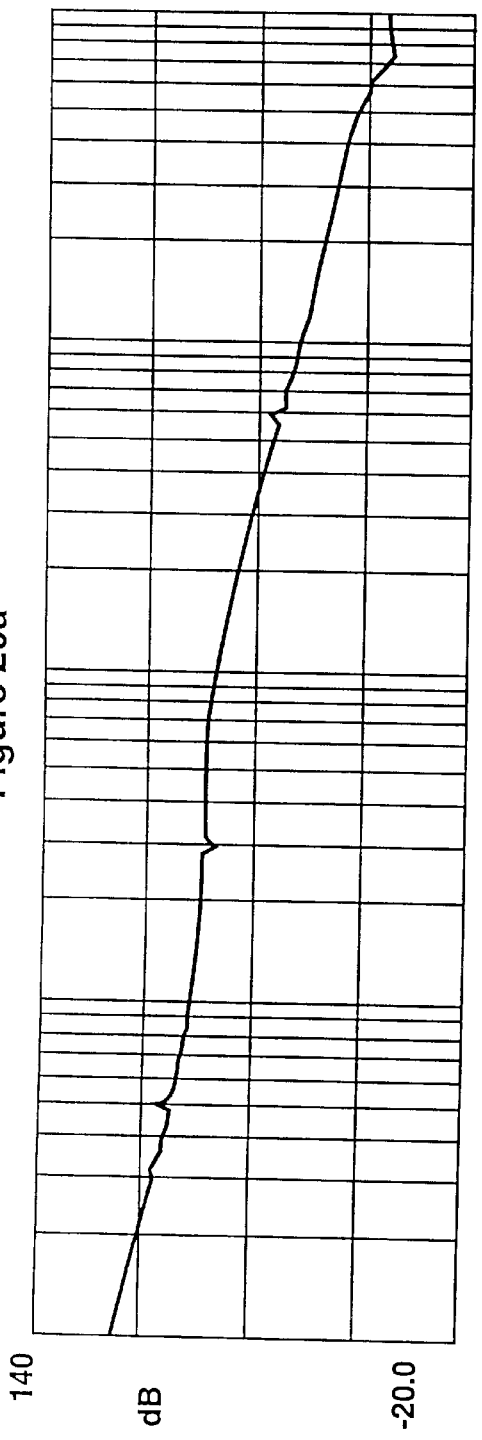
FIGS. 20a and 20b are Bode plots of a preferred inner loop compensation function.
Figure 20B:
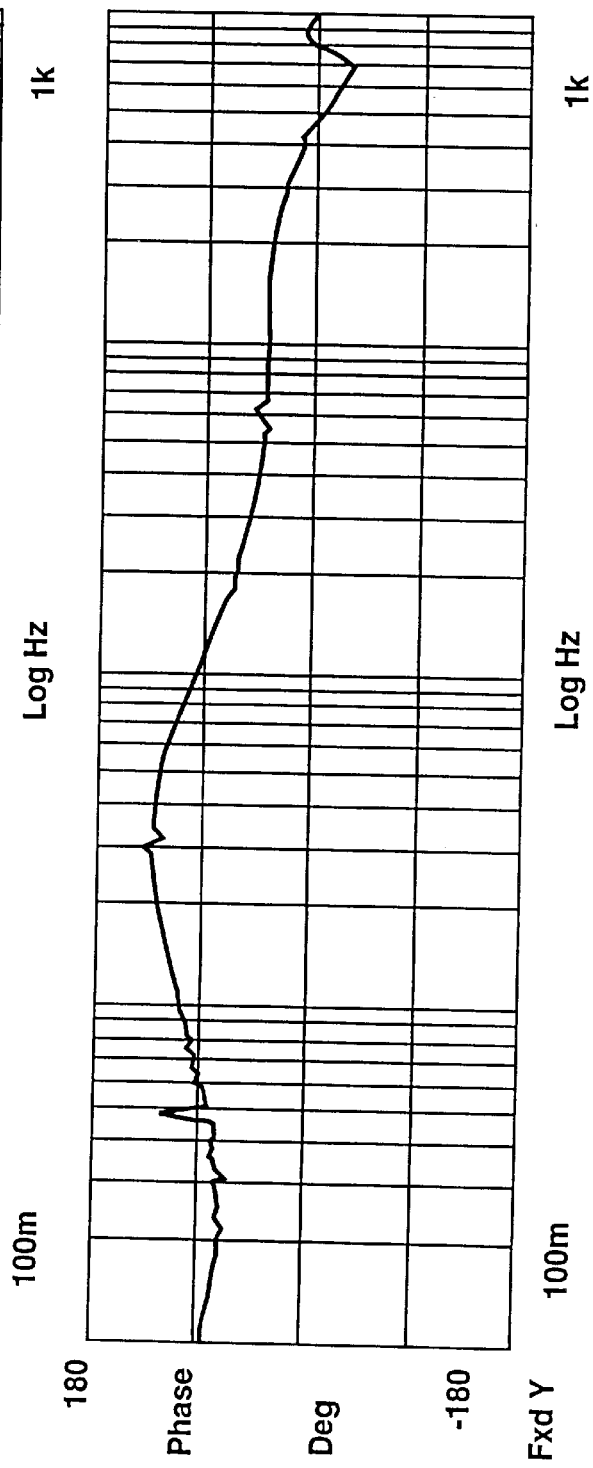

FIGS. 20a and 20b are Bode plots of amplitude versus frequency and phase versus frequency for the compensation function C(s). In FIG. 20a, the ordinate expresses frequency in decibels between −20 and 140 decibels. Frequency is expressed logarithmically on the abscissa between 100 mHz and 1 kHz. In FIG. 20b, the ordinate shows phase between −180 and +180 degrees with the frequency once again being expressed logarithmically fashion between 100 mHz and 1 kHz.

Figure 21A:
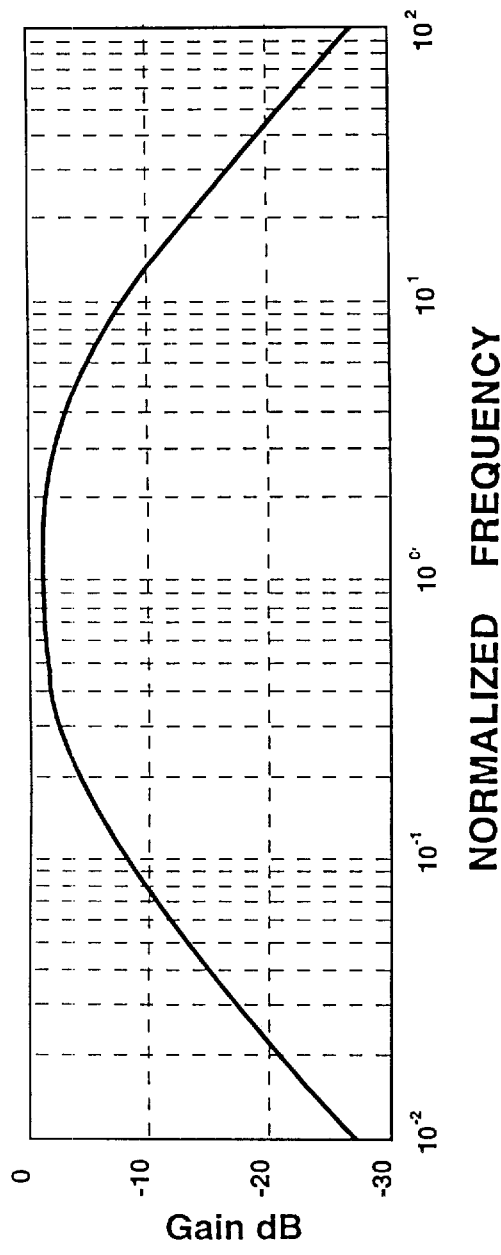
FIGS. 21a and 21b are Bode plots of a preferred outer loop compensation function.
Figure 21B:
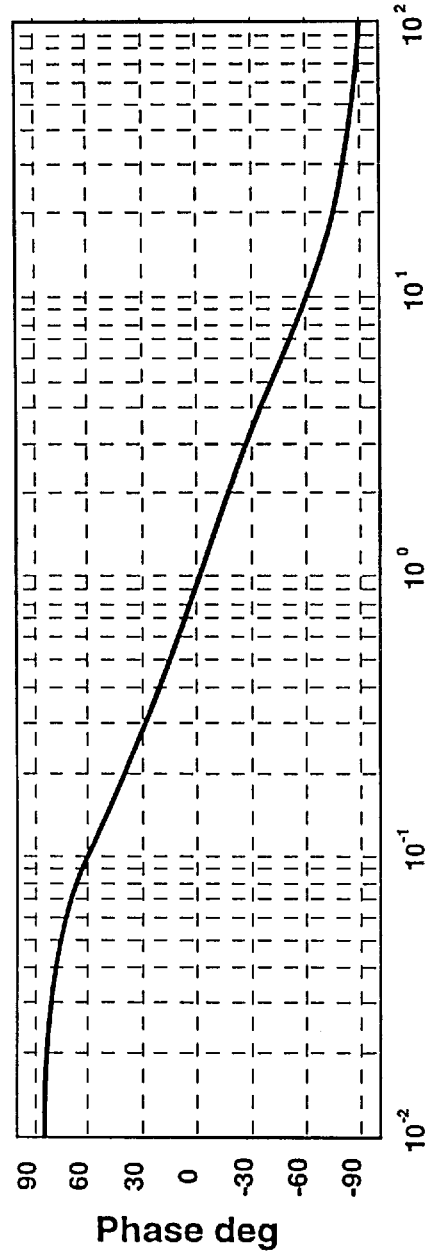

FIGS. 21a and 21b are Bode plots for the preferred outer loop compensation function Cv(s). The abscissa of the graphs shown in FIGS. 21a and 21b are normalized frequencies such that $\omega_c$ the passive isolator resonant frequency, equals 1 ($10^0$). The gain in FIG. 21a has also been normalized since the "position" of the gain curve depends on the sensor sensitivity and other factors. Gain is shown in decibels. Since the outer loop is only concerned with the resonance produced by the cup mount, there is an intentional attenuation when one moves away from the resonance frequency $\omega_c$. In general, the compensation function can be expressed as $$C_v(s) = \frac{S(\text{Gain})}{(\tau_1 s + 1)(\tau_2 s + 1)} \tag{9.1}$$

The pass band is selected to be approximately an octave above and below the cup mount frequency. The first pole $1/\tau_1$ may even be selected to be lower than $\omega_c/2$; for example, when $\omega_c$ is 20 hertz, $1/\tau_1$ may be selected as 5 hertz. The other pole, $1/\tau_2$, in this instance may be chosen as 40 hertz. The rolloff prior to the first pole is a DC block function such that there is no reaction to a constant displacement.

Given the illustrated Bode plots shown in FIGS. 20a, 20b, 21a and 21b, and given the block diagram shown in FIG. 19, it is well within the skill in the art to program the digital signal processor 808 (FIG. 18) with the appropriate transfer functions necessary to compensate for resonances in the raw sensor signals.

Figure 5:
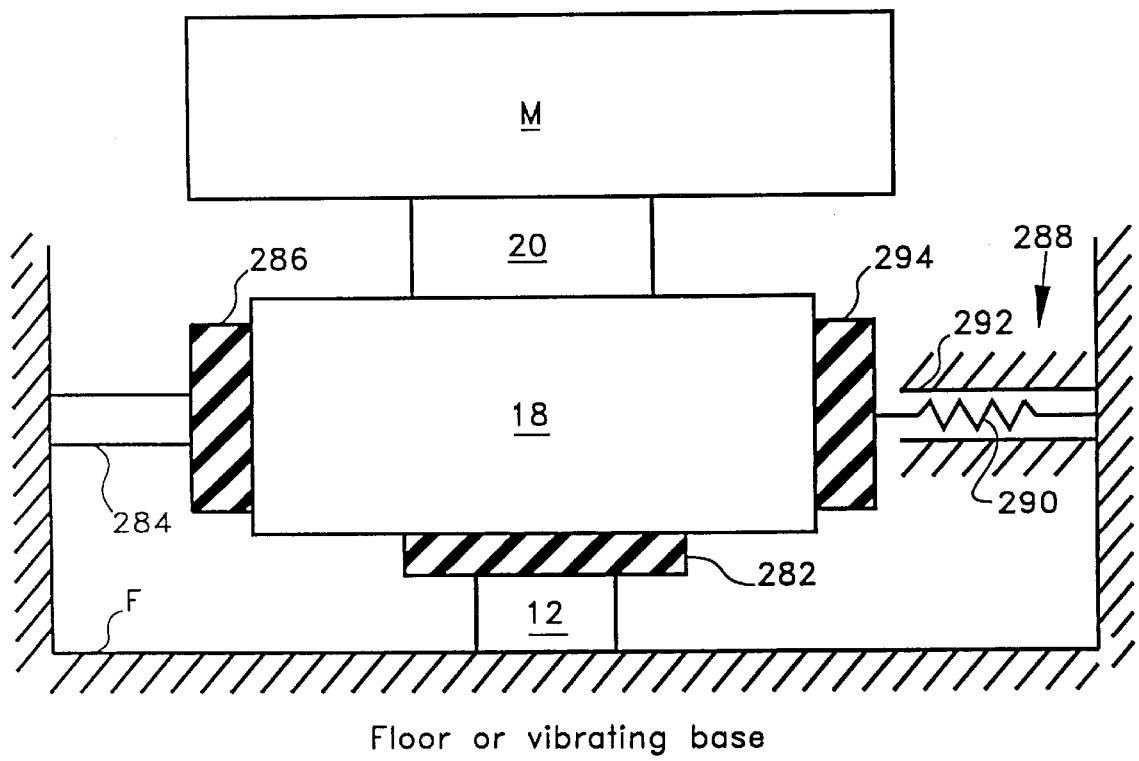
FIG. 5 is a simplified schematic physical block diagram embodiment of the active vibration isolation system showing isolation along two axes.

FIG. 5 is a simplified schematic physical diagram of the active vibration isolation system in two dimensions. As per FIG. 1, a supported payload M rests on a passive isolator (preferably, an elastomeric type mount) 20, which in turn is supported by a small mass 18. A shear decoupler 282 is interposed between the small mass 18 and the vertical piezoelectric motor stack 12. FIG. 5 also illustrates active vibration isolation in a direction normal to the (typically gravitational) force exerted by the payload. This isolation is performed using a radial stiff actuator (preferably a piezoelectric motor) 284 and a radial shear decoupler 286. The radial motor 284 is attached in some manner to the vibrating floor or base F. The shear decoupler 286 is interposed between the radial motor 284 and the small mass 18.

Where the radial stiff actuator motor 284 is a piezoelectric stack, it is necessary to preload the radial motor 284 such that under actual operation the motor element 284 never goes into tension. A compression spring element indicated generally at 288 is used to preload the radial motor 284. In a preferred embodiment, the spring element includes a spring 290, such as a conical steel spring, which as guided by a rubber or elastomer coaxial bushing 292. The spring element 288 is disposed between an extension of the floor or vibrating base F and a shear decoupler unit 294, which in turn is interposed between the spring element 288 and the small mass 18. The linear arrangement of radial motor 284, decoupler 286, decoupler 294 and spring element 288 is repeated in a direction normal to the paper in FIG. 5 to achieve vibration isolation in all three dimensions.

Where the stiff actuator motor 284 is piezoelectric, the maximum radial vibration excitation is approximately 0.001 inches for the total excitation spectrum. The preload compression on the piezoelectric motor element should be slightly greater than 0.001 inch, such as 0.0015 inches. The force required to compress the piezomotor 284 by this amount is about 1000 pounds. The preferably conical steel spring 290 is preloaded by a compression set screw or other means (not shown in FIG. 5) to provide the required pound thrust force in the compression direction of the radial piezoelectric motor element 284.

The coaxial spring element 288 has low stiffness along its axis that is parallel to axis of the radial motor 284, but very high stiffness along a radial direction therefrom. Thus, the coaxial spring element 288 allows radial motor element 284 to contract or elongate readily according to the command signal applied to it. While the coaxial spring element 288 has a small spring stiffness value in the axial direction, it is very high in mechanical stiffness in all directions normal to its axis. This arrangement allows the radial piezoelectric motor element 284 to move freely in the radial isolator direction loaded only by the small stiffness of the vertical motor decoupler and the coaxial and conical spring elements. The interposition of the decoupler 286 between the radial motor 284 and the small mass 18 lowers the shear deflection caused by, e.g., the movement of payload-supporting piezoelectric motor 12 to 0.7% of the movement of radial motor 12.

It is desired that small mass 18 move only in the vertical direction and not to rotate as the vertical motor 12 extends or contracts. Therefore, decoupler 286 is balanced on the other side of small mass 18 by decoupler 294 and coaxial bushing 292.

Figure 6:
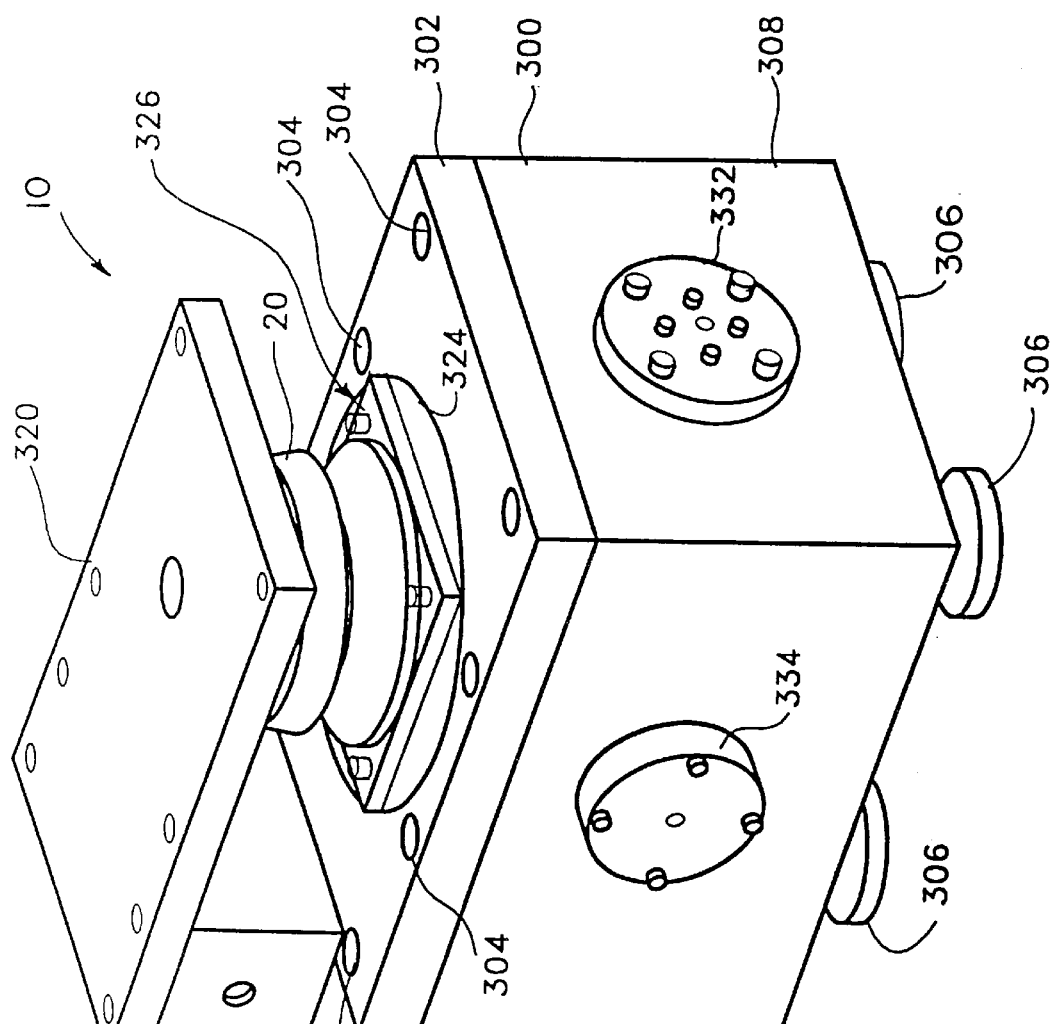
FIG. 6 is an isometric view of a first physical embodiment of the active vibration isolation system.
Figure 7:
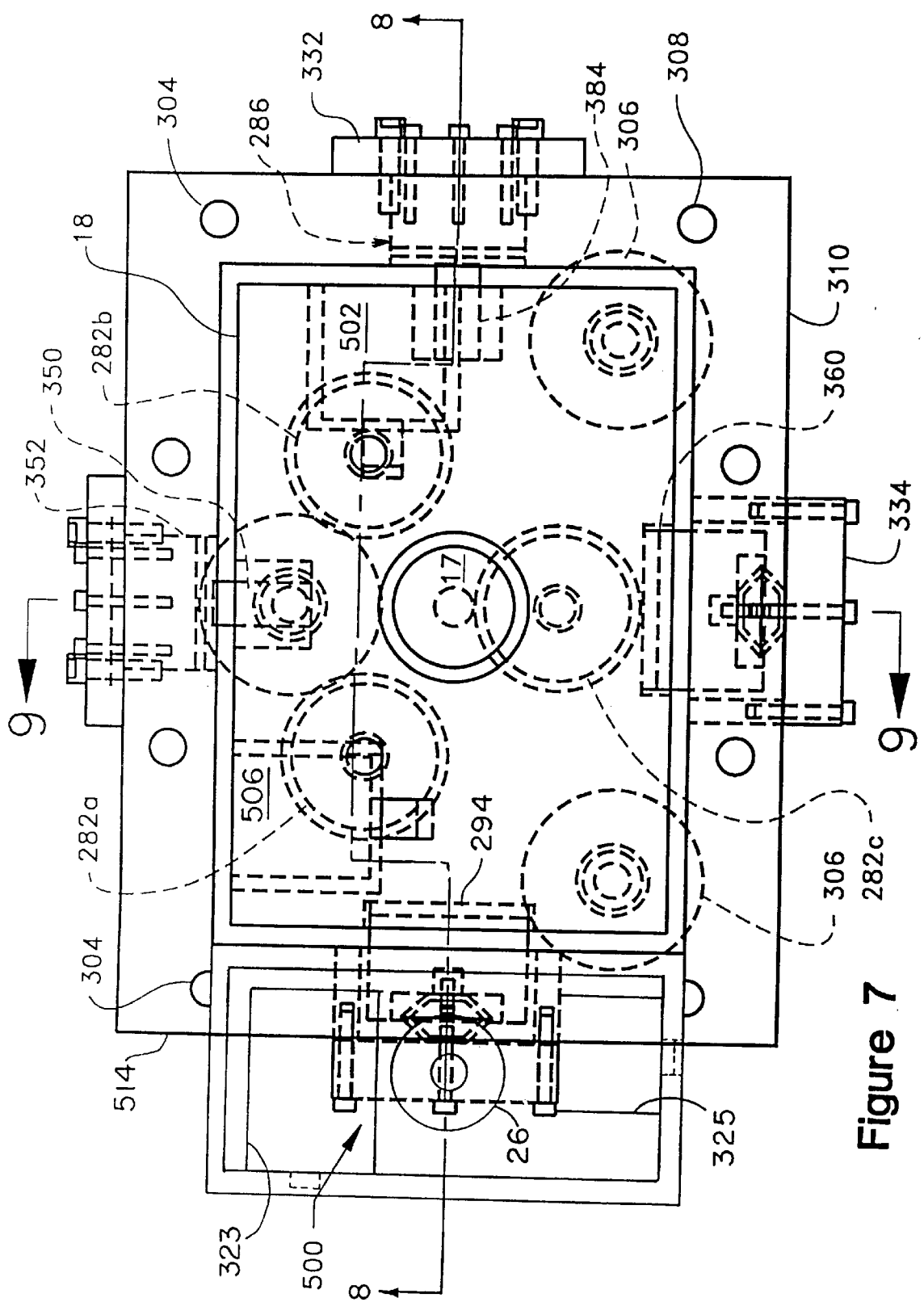
FIG. 7 is a plan view of the embodiment illustrated in FIG. 6, with selected parts shown in phantom and the top plate removed for purposes of clarity.
Figure 8:
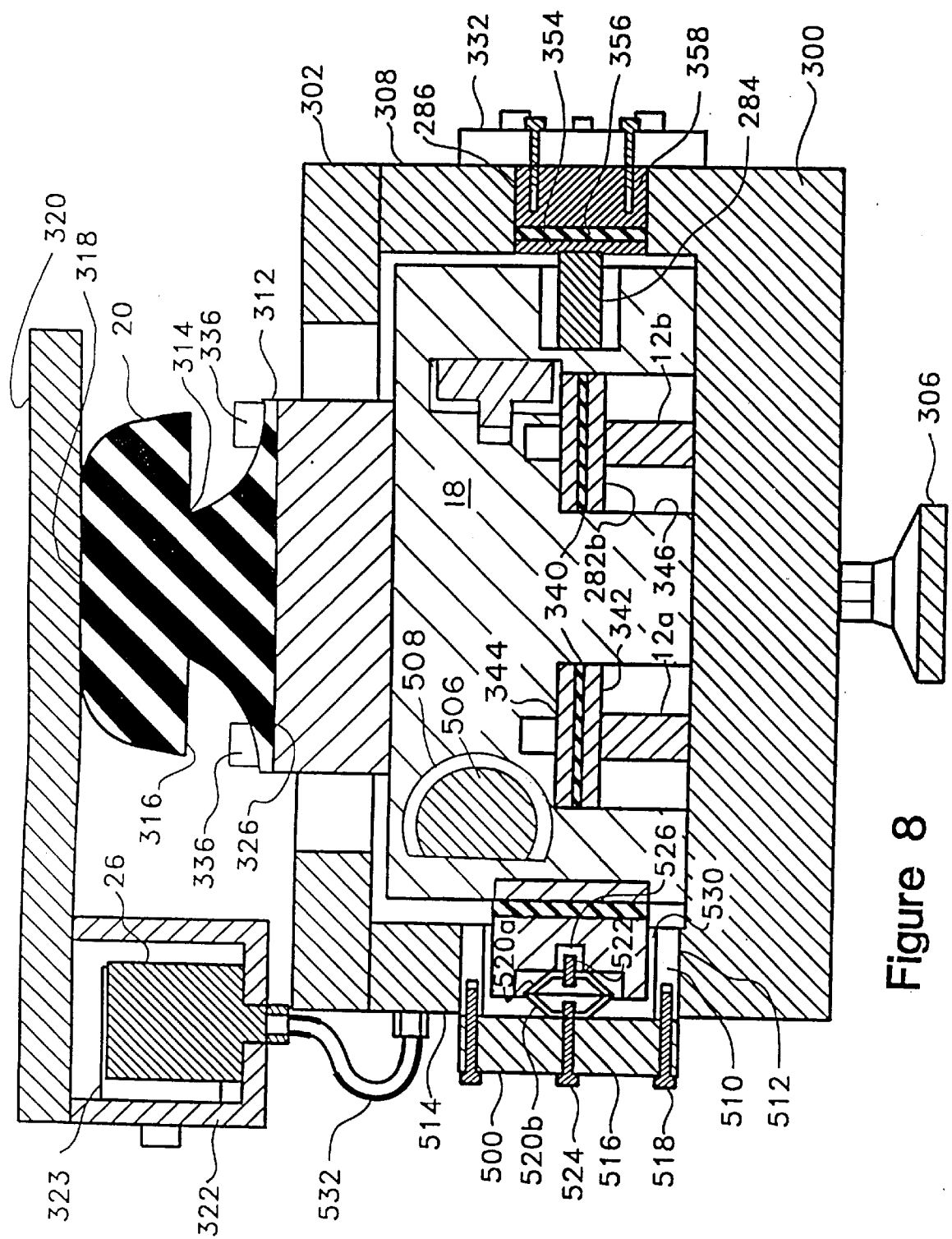
FIG. 8 is a schematic sectional view taken substantially along line 8—8 of FIG. 7.

FIGS. 6–9 are detailed mechanical views of a first physical embodiment of the invention, with FIG. 6 being an isometric view, FIG. 7 being a plan view with certain parts being shown in phantom, FIG. 8 being an elevational sectional view taken substantially along line 8—8 of FIG. 7, and FIG. 9 being an elevational sectional view taken substantially along line 9—9 of FIG. 7. Turning first to FIG. 6, the active vibration isolation system indicated generally at 10 has its mechanical components contained within an outer housing or case 300 which, in this illustrated embodiment, is rectangular in shape. It should be noted that in operation, three active vibration isolation systems 10 are used to support a single payload mass M (not shown) in a tripod configuration. Case 300 includes sidewalls 308 and 310 and two further sidewalls (not shown; see FIGS. 6–8), one each of which is parallel, respectively, to sidewalls 308 and 310. A top 302 of the case 300 is a separate attachable unit. The outer case 300 must be rigid to provide for high modal resonance frequencies in order to obtain good high frequency active vibration isolation. The first mode of vibration of the outer housing 300 should be above 1500 cycles per second. To obtain this, the outer housing 300 should be fabricated of a lightweight metal such as aluminum, and should have relatively thick walls. The outer housing 300 may be made from a casting or bolted together from machined plates. Preferably, the outer housing 300 is manufactured using a die casting procedure.

The top plate 302 is bolted to the outer case 300 using bolts 304. Like outer housing 300, the top 302 should be made from a light rigid material such as aluminum or other light metal, and should be as thick as is practical. In the illustrated embodiment, the thickness of the top 302 and the walls of the outer housing 300 is approximately 1.5 inches.

Three feet 306 are attached to the bottom of the outer housing 300, preferably by means of swivels. This is so that the feet can conform to the possibly nonflat surface of the floor. However, feet 306 should not be adjustable in height. If the bottom feet 306 were changed in vertical height with the isolator 10 in place and the supported payload $M_P$ (not shown) in place on cover plate 320, a height change of any one of the bottom feet 306 would cause the isolator outer case 300 to rotate in a manner which would produce a large shear load on the passive isolator 20. This shear load would in turn place a large torque on the small mass (not shown; see FIGS. 7–9), which in turn would place potentially large shear loads on the piezoelectric motor elements (not shown; see FIGS. 7–9). If the resulting twisting on the small mass is large enough, the piezoelectric motors will be overstressed in shear and will crack, which will render the motor elements inoperative.

Figure 6A:
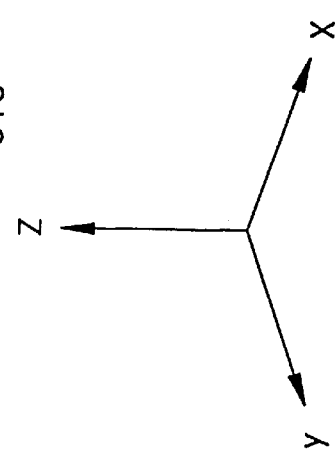
FIG. 6a is a cartesian coordinate reference for FIG. 6.

In the illustrated embodiment, the passive vibration isolator 20 is an elastomeric cup mount manufactured under part number UC-4300 by Barry Controls of Brighton, Mass. A similar isolator may be obtained from Tech Products Corporation of Dayton, Ohio. The passive isolator 20 preferably has equal dynamic spring stiffness in all directions, X, Y and Z, as identified in FIG. 6a. The passive isolator dynamically decouples the heavy supported payload mass $M_P$ (see FIG. 1) from the small mass 18 (shown in FIGS. 7–9), and provides vibration isolation of the supported payload in all directions of vibration above the frequency where good active vibration isolation is provided by the stiff actuators and compensation circuitry.

The selection of the resonance frequency of the passive vibration isolator 20 is formed by a tradeoff of high frequency vibration isolation on the one hand, and the dynamic deflections of the supported payload resulting from forces acting on the supported payload itself on the other. A particularly preferred resonance frequency for isolator 20 is approximately 20 hertz.

In the illustrated embodiment, the passive isolator 20 includes a broad base 312 (FIGS. 7 and 8). The diameter of the isolator or cup mount 20 decreases as one proceeds vertically upward, coming to a constriction 314 at which the radius of the cup mount 20 is at a minimum. From this point, the profile of the cup mount 20 extends radially outwardly for a predetermined distance to a lip 316. The profile of the cup mount 20 then curves convexly towards its top 318.

A top plate 320 is affixed to the top 318 of the passive isolator 20. The top plate 320 assures that the weight of the supported payload mass is distributed over the entire top 318 of the cup mount isolator 20. The top plate 320 also supports a case 322 which contains three velocity control loop geophone sensors 26, 323 and 325 (see FIG. 7), each of which are disposed to sense movement of the payload in the Z, X and Y directions, respectively. Their axes of sensitivity are aligned with the axes of elongation/contraction of respective ones of the stiff actuators 12a–c, 284 and 350.

The top 302 of external enclosure 300 has a large central orifice 324 into which is received a spacer plate 326.

The supported payload sensor enclosure 322 should be supported by the cup mount cover plate 320 in a manner such that the resonance frequencies of the plate 320, the top of isolator 20, and the weights of sensors 26, 323 and 325 are high. The higher these resonance frequencies are, the better the absolute velocity control loop can be made to function.

Visible in FIG. 6 are the radial decoupler retainer plate 332 for the radial piezoelectric motor in the X direction, and a conical spring retainer plate 334 for the radial piezoelectric motor in the Y direction.

The internal structure of this embodiment of system 10 is best illustrated in FIGS. 7–9. FIG. 7 is a plan view of the active vibration isolation system 10, showing selected elements of the internal structure in phantom. FIG. 8 is an elevational sectional view taken substantially along line 8—8 of FIG. 7. FIG. 9 is a transverse elevational selection view taken substantially along line 9—9 of FIG. 7. With particular reference to FIG. 9, the spacer plate 326 is attached as by bolts 336 to the small mass 18.

The small mass 18 is totally supported by vertical piezoelectric motor elements 12a, 12b and 12c and associated vertical decouplers 282a, 282b and 282c. The small mass 18 sits inside cavity 338 and is spaced from the outer case 300 on all sides, such that the only physical contact with the exterior case 300 is through the vertical piezoelectric motor elements 12a–12c and the radial piezoelectric motor elements 284 and 350 (described below).

In the illustrated embodiment, the vertical piezoelectric motor elements 12a–12c are 1.0 inch in diameter by 1.26 inches in vertical height. These motors 12a–12c have a maximum working excursion of 0.001 inches plus or minus. Three vertical motors 12a–12c are used in order to form a tripod-like support, as well as increasing the payload which the vertical motors 12a–12c can support. Each vertical shear decoupler assembly 282a–282c has a very high spring stiffness in the vertical direction, but a very low mechanical stiffness in the X and Y directions; preferably, the ratio of axial (vertical) stiffness to radial (X and Y) stiffness of the shear decoupler is at least one, and more preferably two, orders of magnitude. In the illustrated embodiment, the diameter of the shear decouplers 282a–282c is 2 inches and the diameter of the elastomeric disk or wafer 340 between each of the two decoupler disks 342 and 344 is also 2 inches.

The decouplers 282a–282c and the corresponding radial decouplers (described below) are an important aspect of the invention. The piezoelectric motor elements used in the active vibration isolation system 10 must always be loaded in compression. Any tension load can debond their wafer layers or depolarize the complete motor. To avoid tensile stresses, the motor elements must be configured such that tension loading does not occur in axial loading or in bending loading. Shear loading of the piezoelectric motor elements is allowable so long as the shear loading does not generate bending moments which can cause tensile loading in part of the motor. To limit shear loading within the piezoelectric motor element 12a–c, respective shear decouplers 282a–c are used, each of which consists of two disks 342 and 344 of a hard, nonelastic material such as metal or the like, with a thin disk, wafer or layer 340 of an elastomer sandwiched between.

The axial stiffness of each shear decoupler 282a–c is maintained high while the radial stiffness is maintained very low when the ratio of the loaded area to unloaded area is large. The payload carried by the system 10 is normal to the faces of the elastomer disks 340 and the (preferably) steel disks 342 and 344, while the shear load generated by motion of other motor elements is always substantially in the plane of the elastomer disks 340.

One measurement of the quality of the shear decouplers 282a–c is their shape factor, which is equivalent to the ratio of the area of rubber or other elastomer under compressive load to the unloaded area of rubber around the circumference of the disk. This can be expressed as $$\frac{0.25\pi D^2}{\pi Dt} = \frac{0.25D}{t} \tag{10}$$

where D is the diameter of the rubber disk and t is the thickness of the disk. As the shape factor increases, the effective modulus of the elastomer in compression increases while the effective modulus of the elastomer in shear remains unchanged. In the illustrated embodiment, each of the shear decouplers 282a–c is 2 inches in diameter and the elastomer wafer 340 is about 0.06 inches thick, creating a large diameter to elastomer thickness ratio and a shape factor of about 8.

The motor compression modulus for the illustrated piezoelectric motors 12a–c is 3,000,000 psi, and the motor shear modulus is approximately 1,000,000 psi. The compression stiffness is 1,880,000 pounds per inch, and for shear the vertical motor spring stiffness is about 62,830 pounds per inch.

For the vertical motors 12a–c, the ratio of decoupler stiffness to motor stiffness in the axial direction is 0.7. The same ratio in the radial direction is 0.07. Although they are not of the same size, similar numbers obtained for the radial motors and their respective shear decouplers (described below).

In view of the large voltages applied to the piezoelectric motor elements 12a–c, the shear decoupler elastomers 340 should have resistance to ozone. Such an elastomer is chloroprene rubber, although other ozone-resistant elastomers could also be used. The chloroprene rubber used to constitute elastomer wafers 340 is preferably formulated without reinforcing fillers such as carbon black in order to keep the shear stiffness as low as possible but still retain high mechanical strength. As illustrated, each decoupler 282a–c is interposed between a respective end of a vertical piezoelectric motor element 12a–c and the small mass 18, residing inside of a receptacle 346 formed in the small mass 18 for this purpose. Appropriate holes and channels (omitted for clarity) are formed in case 300 and small mass 18 to communicate with the piezoelectric motors 12a–c.

Each of the piezoelectric motor elements 12a–c consists of a plurality of piezoelectric disks separated from each other by isolation disks. The piezoelectric disks are wired in parallel by a pair of parallel buses, which in turn are connected with a pair of high voltage leads. These details have been omitted for the purpose of clarity, and are well known within the art.

The embodiment of the invention shown in FIGS. 6–9 is provided with two radial piezoelectric motor elements: a piezoelectric motor 350 whose axis is aligned with the "Y" direction (see FIG. 9) and a piezoelectric motor element 284 whose axis is aligned with the "X"direction (see FIG. 8). In the illustrated embodiment, the radial motor elements 284 and 350 are 0.63 inches in diameter and 1.26 inches in length. The diameter is made as small as possible for the required length to maintain the conical spring thrust to practical magnitudes (the conical springs will be described below). The motors 284 and 350 have the same dynamic excursion characteristics as the vertical piezoelectric motor elements 12a–12c.

Radial motor element 284 is provided with a radial decoupler indicated generally at 286 and radial motor element 350 is provided with a radial decoupler indicated generally at 352. Each decoupler assembly 286, 350 includes a front plate 354, an elastomeric wafer 356 and a rear fitting or plate 358. Disk 354, fitting 358 and elastomeric wafer 356 have a diameter that is the same as that of vertical decoupler assemblies 282a–c; disk 354 is similar in thickness to metal disks 344 and 342, and elastomeric wafer 356 is similar to elastomeric wafers 340. Each front disk 354 is counterbored to hold one end of the radial motor 350 or 286 in place. A high-modulus epoxy adhesive is the preferred method of attaching the end of the motor elements 350 and 286 to their respective disks 354. Fittings 358 are threaded cylinders which are threaded into respective sidewalls 359, 308 of exterior enclosure 300.

Referring to FIG. 9, on the other side of small mass 18 in physical opposition to the radial motor 350 and in axial alignment therewith is a further radial decoupler indicated generally at 360. Radial decoupler 360, like radial decoupler assembly 352, includes a metal front disk 362, an elastomeric wafer 364 and a rear cylindrical component 366. The diameter of components 362, 364 and 366 is similar to the diameter of the vertical decoupler assemblies 282a–c. The thickness of disk 362 is similar to that of disk 344, and the thickness of elastomeric layer 364 is similar to that of layer 340. The radial decouplers in the illustrated embodiment are of the same radial size as the vertical decouplers 282a–c for cost reasons only, and other sizes could be used. The disk 362 fits into a bore 368 of the small mass 18.

A radial coaxial bushing 370 is formed by a tube 374 and cylinder 366. These components are preferably made of a machineable metal such as steel, brass or aluminum. The cylinder 366 fits inside the tube 374 with a small gap left over, such as 0.063 inches. An elastomeric gasket 378 is molded in place in between the cylinder 366 and the tube 374.

The coaxial bushing 370 functions like the decouplers 282a–c and decoupler 352 by having a large shape factor in the direction of the bushing radial axis. This gives the bushing a very large mechanical stiffness in the bushing radial direction but a very low mechanical stiffness in the bushing axial direction. In this manner, the radial piezoelectric motor 350 can move the small mass 18 in the "Y" direction with little resistance from the spring stiffness of the coaxial bushing. However, the bushing has a large mechanical stiffness in a direction radial to the bushing axis which prevents radial movement of the bushing 370 that results from the movement of the vertical piezoelectric motors 12a–12c.

A geophone 17 is disposed in a receiving cavity 379 formed in the small mass 18. The geophone has an axis aligned with the "Z" axis of the system 10; or alternatively stated with the axes of motors 12a–c, so as to sense vertical vibration of the small mass 18.

Turning momentarily to FIG. 8, the "X" radial piezoelectric motor 284 is provided with a shear decoupler 286, which in turn is composed of a front plate 354, an elastomeric wafer 356, and a rear fitting 358, all of which can be identical to like components for shear decoupler 352. On the other side of mass 18, so as to be coaxial with the longitudinal axis of radial piezoelectric motor 284, there is provided a radial spring decoupler assembly 294. The spring decoupler assembly 294 includes a front disk 362, an elastomeric disk, wafer or layer 364 and a rear cylindrical component 366, all of which can be identical to like-numbered components of the radial spring decoupler assembly 360. The "X" radial piezoelectric motor 284 is also provided with a radial coaxial bushing 500. Also visible in the section shown in FIG. 8 are the "X" small mass geophone 502 (partially shown), as received within its respective receptacle 504 inside of the small mass 18, and "Y" geophone 506, as shown received within its respective receptacle 508 of the small mass 18. The internal components of geophones 17, 502 and 506 are not shown, as these parts are available from vendors. Geophone 502 has its sensor axis aligned in parallel with the axis of radial piezoelectric motor 284, and is electronically coupled thereto using a circuit which is similar to that shown in FIG. 3. Geophone 506 is aligned with the "Y" axis or the axis of radial piezoelectric motor 350, and is electronically coupled to it (FIG. 8) using circuit 472 (FIG. 4).

Viewing FIGS. 6–9 together, the high mechanical stiffness of the coaxial bushing 370 (FIG. 9) in the radial direction also balances the mechanical stiffness of the small mass 18 along the vertical or "Z" axis. Therefore, a vertical motion of the small mass 18 will cause the decouplers 360, 352, 294 and 286 on each side of the small mass 18 to deflect by equal amounts, thereby preventing the small mass from rotating in roll, pitch or yaw angles. The radial stiffness of the radial coaxial bushings 370 and 500 is about equal to the radial stiffness of the radial piezoelectric motors 350 and 284. The vertical stiffnesses acting on all sides of the small mass 18 are equal, thereby allowing the small mass 18 to deflect in the plane of the tops of the vertical piezoelectric motors 12a–12c. This yields an almost purely vertical translation of the small mass 18 as the vertical motors 12a–12c are actuated.

Returning to FIG. 9, the outer diameter of the coaxial bushing tube 374 is threaded and is received into a threaded hole 380 in case 300. This allows the coaxial bushing tube 374 to be screwed into place in the outer sidewall 310 of the case 300 to temporarily hold the radial piezoelectric motor 350 and the coaxial bushing 370 in place under a slight compression, until such time as a predetermined axial preload may be applied to the radial motor 350 through the use of the conical spring housing (described below).

Conical springs 382a and 382b are disposed to be coaxial with the radial piezoelectric motor 350 and on the opposite side of small mass 18 therefrom. The shape of each conical spring or belleville washer 382 has been greatly exaggerated for clarity; it is actually much flatter. The conical springs 382a–b give a constant compression force when compressed by the proper amount. Conical washers 382a–b are preferred because their compact size and very low cost; however, other compression means can be employed to place a predetermined compressive force on the piezoelectric motor 350, such as rubber, elastomer or steel die springs or even common compression coil springs.

In the illustrated embodiment, two conical washers 382a and 382b are put front-to-front to lower friction within the spring for more linear characteristics. Conical washers of this kind are, for example, manufactured by the Schnorr Corporation of Woodside, N.Y. The coaxial bushing inner cylinder 366 (the same component also acting as a portion of the shear decoupler 360) is formed or machined to hold the inner conical washer 382b in place. For example, a counterbore 384 may be bored into the cylinder 366 and an insert 386 placed therein. Into this is threaded a set screw or pin 388 by which the washer 382b is held in place.

An outer conical spring retainer plate 334 has a central bore 390 into which is threaded a screw 392 which acts to hold the conical washer 382a in place. Other means for affixing the conical washers 382a and 382b in place may be used. The conical spring retainer plate 334 is secured to the bushing tube 374 (or, alternatively, to the outer sidewall 310) using socket head cap screws 394 or the like.

The offset between the coaxial bushing tube 374 and the cylinder 366 is preselected such that when the conical spring retainer plate is put in place, a compressive force of approximately 300 pounds in placed on the piezoelectric radial motor element 350. The retainer plate 334 is mounted by screwing in the coaxial bushing 370 until contact is made with all radial components in the "Y" direction, then adding up to a ¼ to ½ turn until firm contact is made. In this manner, the radial components and small mass 18 are held in place by a small force due to the axial loading of the coaxial bushing until the conical washers 382a, 382b are in place and precompressed. The precompression force will hold the isolator 10 together until it is installed under the supported payload.

Returning to FIG. 8, the radial spring decoupler assembly 294 and radial coaxial bushing 500 may be constructed in a manner similar to and with parts identical to decoupler assembly 360 and coaxial bushing 370 (FIG. 9). Coaxial bushing 500 includes a threaded tube 510 which is threaded into a suitable bore 512 in sidewall 514; an exterior cap 516 is attached to the tube 510 as by means of cap screws 518. A belleville washer is provided which has to opposed halves 520a and 520b. These halves are held in place by respective pins 522 and 524. Pin 522 is received within an insert 526 which is coaxial to the cylindrical component 366. Pin 524 is received into a respective coaxial bore of the end cap 516. An elastomeric cylindrical layer 530 is formed between the bushing cylindrical 366 and the tube 510.

A suitable flexible conductor jacket 532 and associated fittings are attached between the payload geophone case 322 and a hole (not shown) in sidewall 514 of case 300. The conductor jacket 532 provides space for the wires attached to geophones 26, 323 and 325 (FIG. 7). The electrical connections to the geophones and to the various piezoelectric motors have been omitted for the purposes of clarity. In the illustrated embodiment, the compensation circuitry in FIGS. 3 and 4 is located remote to the unit 10, and is connected to the unit 10 through appropriate communication cables (not shown).

Figure 12:
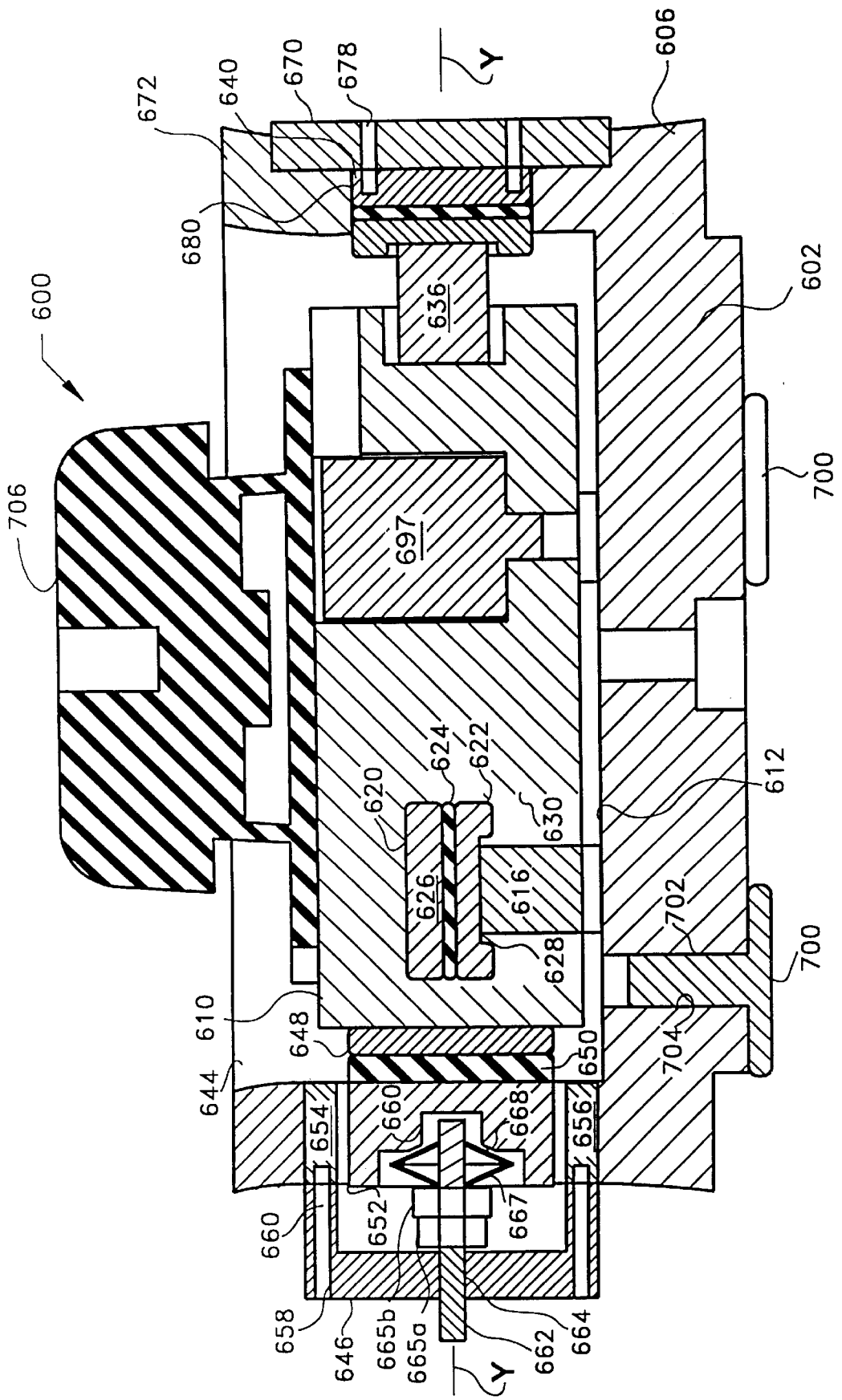
FIG. 12 is an elevational sectional view taken substantially alone line 12—12 of FIG. 11.
Figure 13:
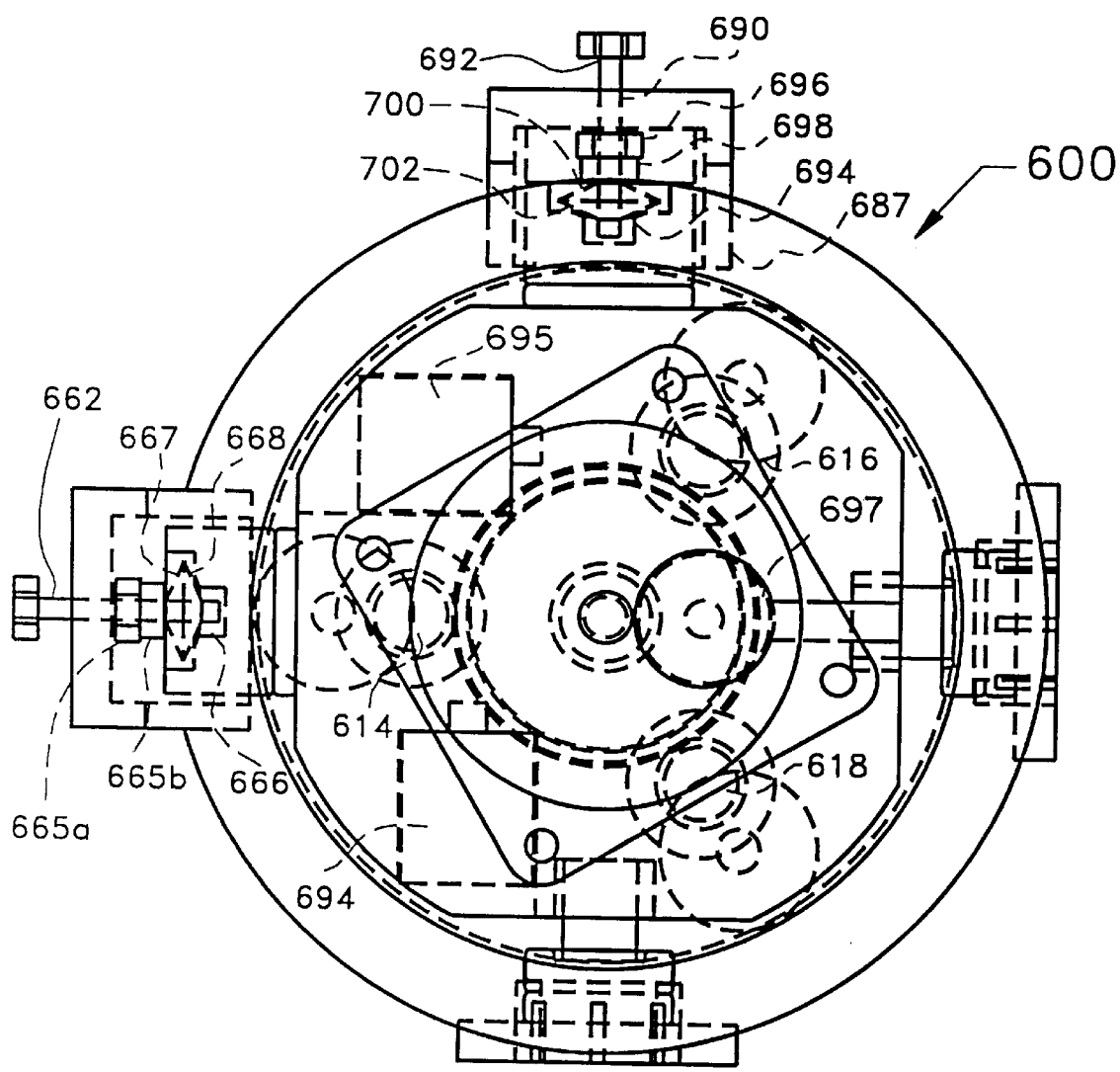
FIG. 13 is a plan view of the physical embodiment shown in FIGS. 10 and 11, with selected interior components shown in phantom.

FIGS. 10, 10a, 11, 12 and 13 illustrate a second embodiment of the invention, in an approximately cylindrical form. FIG. 10 is an exploded isometric view of an active vibration isolation system indicated generally at 600. FIG. 10a illustrates a coordinate system for FIGS. 10 and 11. FIG. 11 is an isometric view showing system 600 in an assembled condition. FIG. 12 is a schematic crosssectional view taken substantially along line 12—12 of FIG. 11. FIG. 13 is a plan view of the system 600 showing certain internal components in phantom.

With reference to FIGS. 10–13, the system 600 is housed in a cylindrical case 602 defining a cavity 604. The case 602 is concave in its external sidewall 606 and, in parallel, is convex on its interior sidewall surface 608. A small mass 610 is received within the cavity 604 so as to be spaced from the interior sidewall 608 and a bottom 612 of the case 602. The small mass 610 is supported by three stiff actuators or piezoelectric motors 614–618. Each vertical piezoelectric motor 614–618 has a vertical shear decoupler assembly, one shown for example in connection with piezoelectric motor 616 at 620 (FIG. 12). The vertical decoupler assembly 620 is, as in the previous embodiment, composed of a lower metal plate 622, an elastomeric wafer or disk 624 and an upper metal plate 626. Components 622–626 have the same dimensions and characteristics as like components in the embodiment shown in FIGS. 6–9.

Taking motor element 616 as an example, a top thereof is received within a recess 628 of the lower decoupler assembly plate 622. The bottom of the motor element 616 rests on interior bottom surface 612 of the case 602. The decoupler assembly 620 and the motor element 614 are received within a bore 630 in the small mass 610. Small mass 610 is formed to have curved surfaces 632 (see FIG. 10) so as to fit within cavity 604 and also to reduce the weight of small mass 610.

The bore 630 in the small mass 610 has, at its innermost portion, a relatively smaller radius to closely receive upper decoupler assembly plate 626. Bore 630 is of slightly larger radius throughout the rest of its extent so as to more loosely receive elastomeric disk or wafer 624, lower plate 622 and the piezoelectric motor 614, allowing disk 624 and plate 622 to move laterally with respect to small mass 610.

As before, the small mass 610 is also isolated from the case 602 in "X" and "Y" directions by respective stiff actuator or piezoelectric motor elements 634 and 636, respectively.

A shear decoupler assembly 640 is shown in FIG. 12 as associated with the "Y" piezoelectric motor element 636. Similarly a decoupler assembly 642 is associated with "X" piezoelectric motor element 634 (FIG. 10). Decoupler assemblies 640 and 642 each include a proximal metal plate, an elastomeric disk or wafer and a remote metal plate, and are preferably identical to the vertical decoupler assembly 20 for ease in manufacture.

The piezoelectric motor element 636 and the decoupler assembly 640 are positioned to be coaxial with the "Y" axis, shown in FIG. 12. Also coaxial with the "Y" axis is a further bushing decoupler assembly indicated generally at 644 and a horizontal force cap 646. The decoupler assembly 644 includes a proximal plate 648 that, when assembled, is adapted to engage a flat vertical sidewall of the small mass 610. An elastomeric wafer or disk 650 is disposed to be adjacent the metal plate 648. A cylindrical metal decoupler assembly element 652 is disposed adjacent the elastomeric disk 650 in opposition to the proximal plate 648.

A tubular sleeve 654 is screwed into a bore 656 of the case 602. The internal radius of the sleeve or tube 654 is such that there is a substantial clearance between it and the cylindrical bushing component 652.

The force cap 646 is provided with a plurality of bores which are adapted to line up with corresponding bores in the sleeve 654. Cap screws (not shown) are received within the threaded bores 658 and 660 to attach the force cap 646 to the sleeve 654.

A central screw 662 is received within an axial bore 664 of the horizontal force cap 646. The bore 664 is threaded. The screw 662 is a long socket head screw and is long enough to be received within a non-threaded clearance bore 666 of the cylinder 652. The set screw 662 is threaded into the force cap 646 and two locking jam nuts 665a and 665b are screwed onto the socket head cap screw 662. The locking jam nuts 665a and 665b are positioned, then locked by tightening together on socket head cap screw 662. The locked position of the jam nuts 665a and 665b are set to position two conical washers 667 and 668. The position of the locked jam nuts 665a and 665b are such that when the two conical washers are precompressed the socket head cap screw 662 does not contact the cylinder 652. Bore 666 is of a diameter such that the socket head cap screw 662 does not contact it. The conical washers 667 and 668 are held in position on socket head cap screw 662 with the inner diameter of washer or conical spring 667 in contact with the jam nut 668. The outer diameter of conical spring 667 is in contact with the outer diameter of conical spring 668. The inner diameter of conical spring 668 is held coaxial to the conical spring 667 by the outer diameter of the socket head cap screw 662. The conical spring 668 inner diameter is in contact with the cylinder 652 around the bore 666.

Alternatively, jam nuts 665a and 665b may be replaced by a machined step (not shown) in screw 662, such that the radius of screw 662 is reduced after the step. Conical washers 667 and 668 would then be slid onto the reduced shaft of screw 662 until the step was reached, the step then acting as a physical stop in contact with the inner diameter of washer 667.

The piezoelectric motor 636 is precompressed by tightening the socket head cap screw 662 by a predetermined displacement dependent on the load versus deflection characteristics of the conical washers 667 and 668 so as to produce an axial thrust of 300 pounds force required for the precompression of the piezoelectric motor element 636.

In another alternative embodiment (not shown), the illustrated washers 667 and 668 may be duplicated, such that a string of four, six or eight washers is strung onto screw 662 and is interposed between the jam nut 665 and the bore 666. This replication of belleville washers would then also take place in the "X" direction.

One important aspect of both this and the first embodiment (FIGS. 6–9) is the positioning of the "Y" axis (and the "X" axis, see FIG. 13) with respect to the vertical decoupler assemblies 620 (one shown in FIG. 12). The vertical decoupler assemblies 620 are positioned such that the "Y" axis of motor 636 is substantially in the horizontal plane of the vertical shear decoupler elastomers 624a, b and c. In this manner, force transmitted along the "Y" axis produces no bending moment or force on the vertical motor elements 614–618 or rotation of the small mass 610.

On the other side of the small mass 610, a horizontal piezo stack retainer plate 670 fits within a receptacle or bore 672 in the sidewall 606 of the case 602. Appropriate threaded bores 674 and 676 (FIGS. 10 and 11) are formed within the sidewall 606 and the retainer plate 670 to attach the retainer plate 670 to the sidewall 606 with appropriate screws (not shown). Screws (not shown) are also received within threaded bores 678 (FIG. 12) so as to attach a distal metal plate 680 of the horizontal shear decoupler assembly 640 to the retainer plate 670. The structure illustrated in FIG. 12 for the "Y" direction is repeated in the "X" direction.

Referring particularly to FIG. 10, a stack retainer plate 682 fits within a corresponding receptacle 684 in the sidewall 606, and is adapted to hold the "X" decoupler assembly 642 against the piezoelectric motor 634. A sleeve or tube 686 screws into a bore 688 on the opposite side of small mass 610 on the "X" axis. A horizontal force cap 690 has a central set screw 692 which is threaded into a central bore 690 and extends into a non-threaded clearance bore 694 which is axially formed in cylinder 687. As before, jam nuts 696 and 698 are threaded onto the set screw 692 (alternatively, these may be replaced with a machined step in the screw 692 such that the remaining shaft of screw 692 has a reduced radius). A pair of conical springs or belleville washers 701 and 703 are compressed between jam nut 700 and the lip of central bore 694, and are held in place by the shaft of the set screw 692. In FIG. 10, jam nuts 665a and 665b and conical springs 667 and 668 have been omitted for clarity.

For each of the "X", "Y" and "Z" axes, respective geophones 694, 695 and 697 (best seen in FIG. 13) are provided, and are installed within appropriate cavities within the small mass 610. Three feet 700 each include a shaft 702 which is screwed into an appropriate threaded bore 704 on the bottom of the case 602.

A passive isolator, in the illustrated embodiment an elastomeric cup mount 706, is directly affixed to the top of small mass, 610 via a flange 708 and screws (not shown) which are threaded into appropriate bores 710 (FIG. 10). In this embodiment, the payload mass rests directly on the top of the cup mount 706 rather than on any intervening structure. Also in the illustrated embodiment, there is not provided any payload motion sensor feedback loop, and thus the sensors and case provided for this purpose for the embodiment shown in FIGS. 6–9 do not appear here. Of course, where a velocity feedback loop to measure the velocity of the payload mass is desirable, one can be added to the structure shown in FIGS. 10–13.

Figure 14:
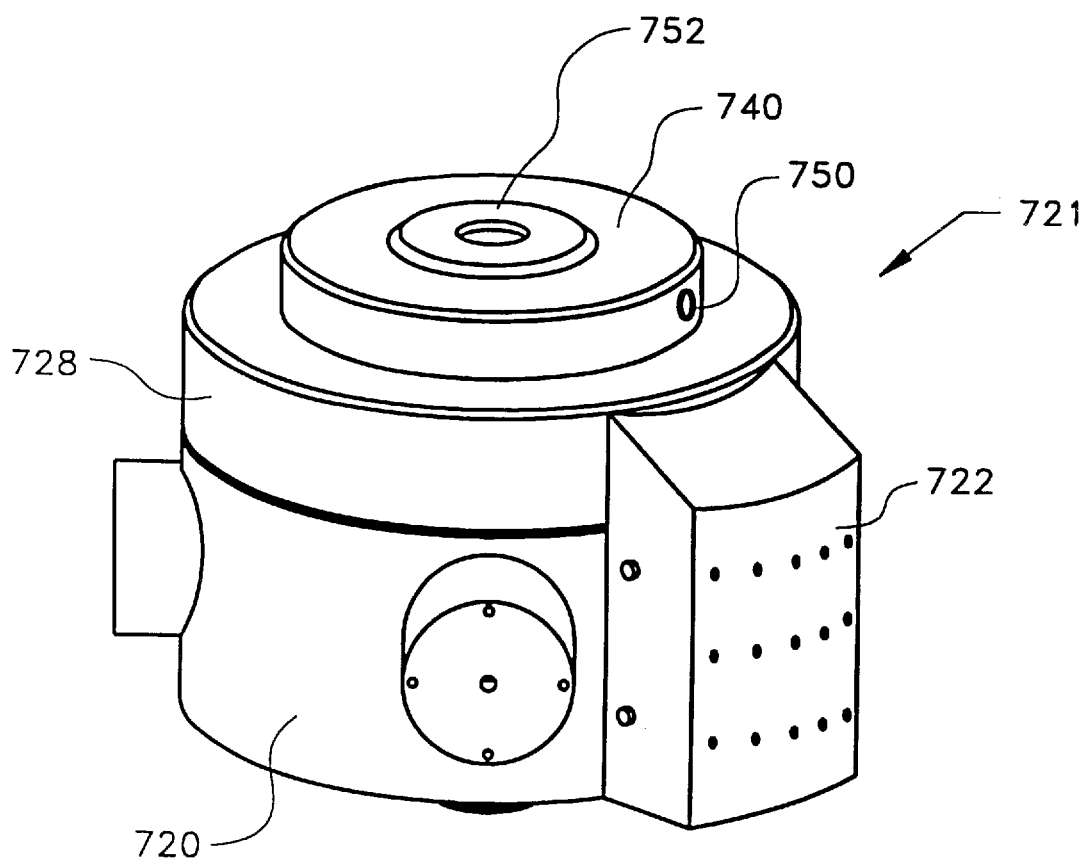
FIG. 14 is an isometric view of a third embodiment of the invention in an assembled condition.
Figure 15:
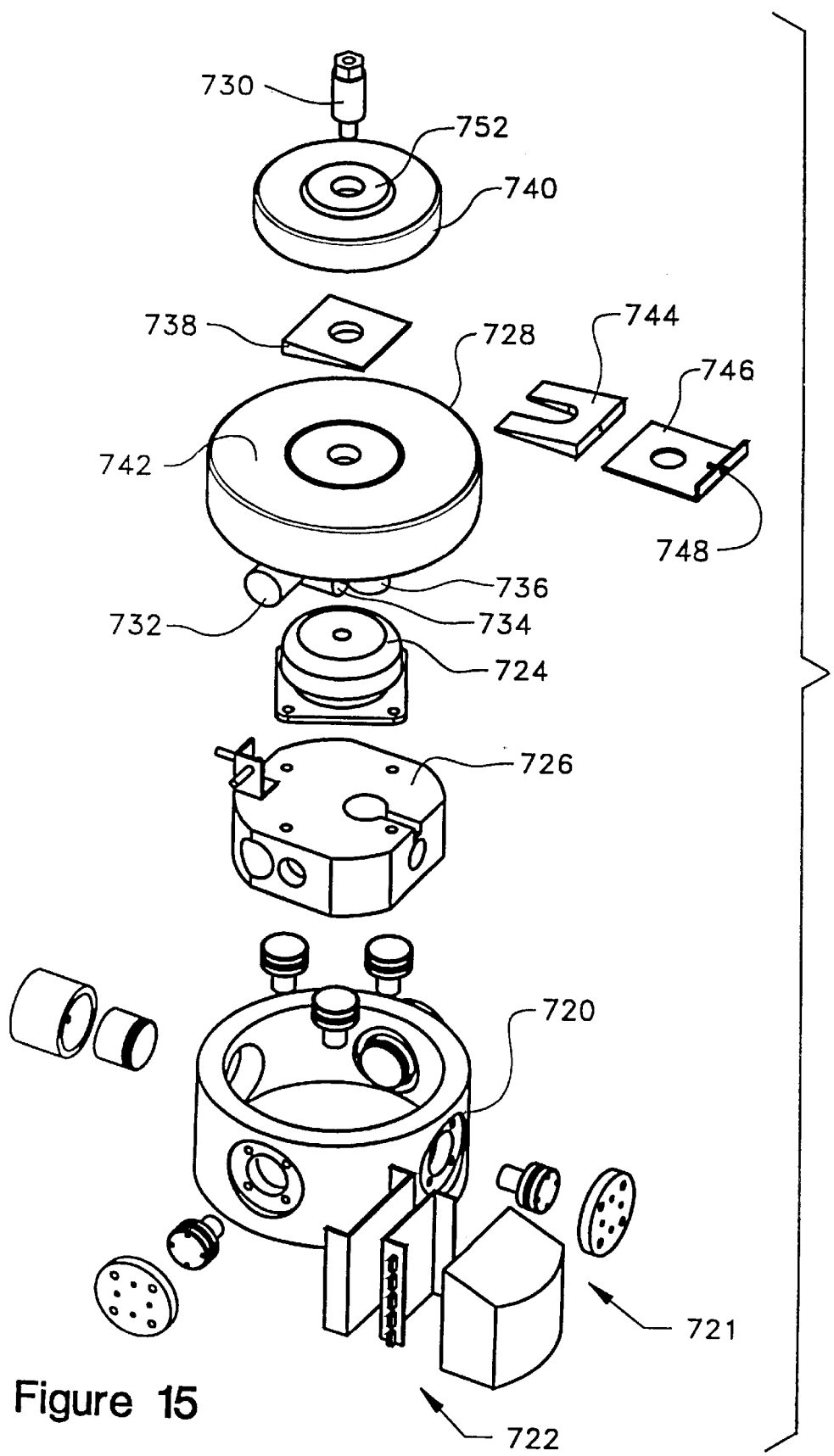
FIG. 15 is an exploded view of the components of the embodiment shown in FIG. 14.

A further embodiment 271 of the invention is illustrated in the isometric view shown in FIG. 14, and the associated exploded view shown in FIG. 15. The embodiment shown in FIGS. 14 and 15 is in general similar to the embodiment illustrated in FIGS. 10–13, and only the principal differences will therefore be discussed. Attached to the exterior case 720 is a circuit box 722 which houses the compensation circuitry illustrated in FIG. 4. A cup mount or passive isolator 724 is affixed to the top of a small mass 726, as before. The cup mount 724 is attached to a cap 728 by means of a central screw 730. Visible underneath the cap 728 are displacement sensors 732, 734 and 736, which are disposed to sense motion of the payload (not shown) in each of three directions. A lower wedge 738, disposed underneath a sheet metal cover 740, is held in place by central screw 730. A lower wedge 744 is held underneath the sheet metal cover 740 by an L-shaped bracket 746. A set screw (not shown) is threaded through the L-shaped bracket 746 and into a threaded bore 748 to force the lower wedge 744 inward or outward, thereby causing the cover 740 to go up or down. As shown in FIG. 14, the set screw may be fed from an external bore 750 in the side of the cover 740. An elastomeric disk 752 is affixed to the top of the cover 740, and is adaptable to receive the payload.

The embodiment shown in FIGS. 14–15 allows the levelling of the payload by appropriate adjustment of the lower and upper wedges 744 and 738.

Figure 16:
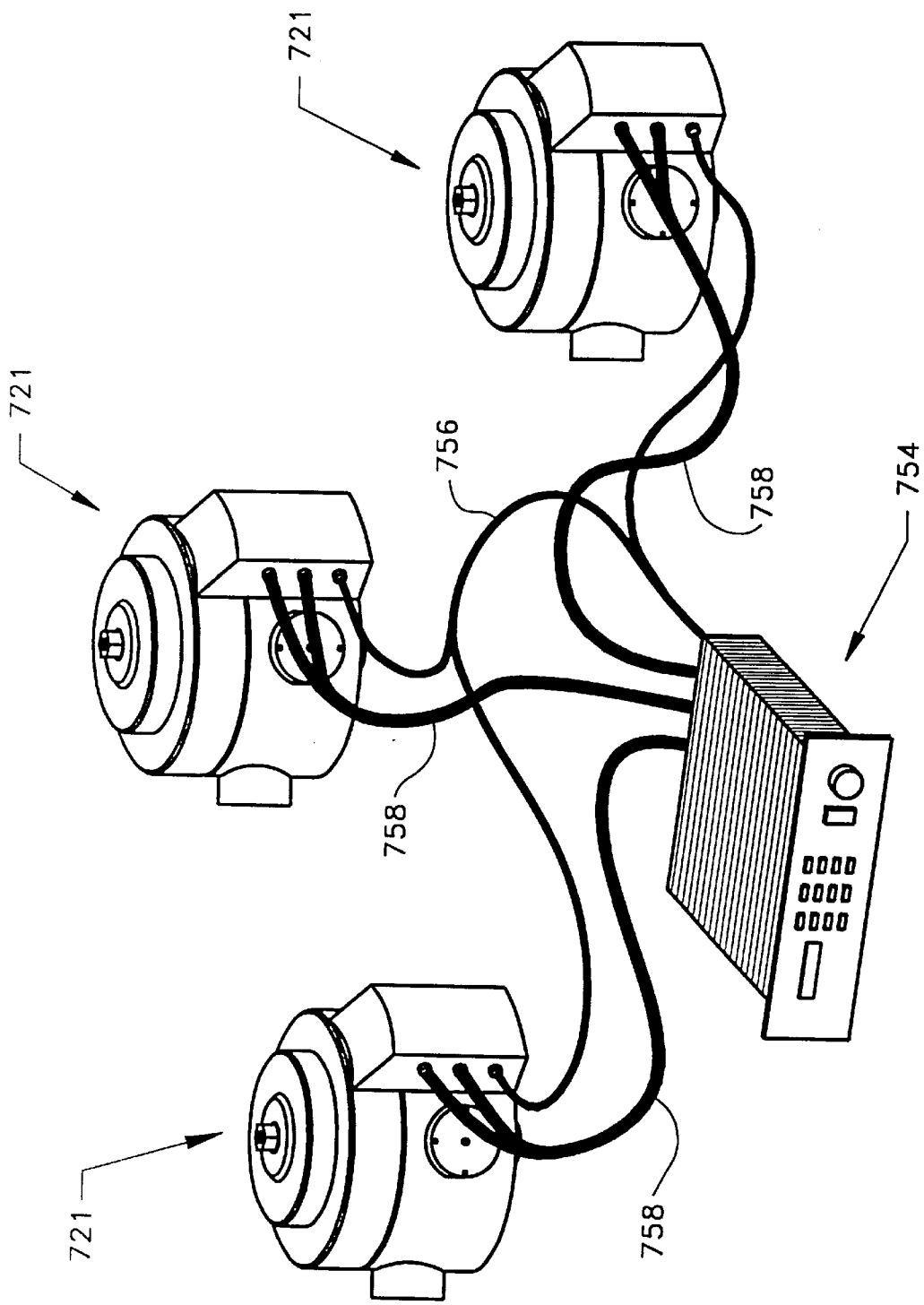
FIG. 16 is an isometric illustration of three active/passive isolation systems as depicted in FIGS. 14 and 15 positioned so as to receive a payload and connected to a user interface/controller.

FIG. 16 is an isometric view illustrating three active/passive isolation systems 721 spread in a triangular formation so as to be ready to receive a payload mass (not shown). The three systems 721 are connected to a user interface/controller 754 so that the user may perform appropriate electronic diagnostics and setup on the systems 721. A power cable 756 and communication cables 758 interconnect the units.

Figure 17:
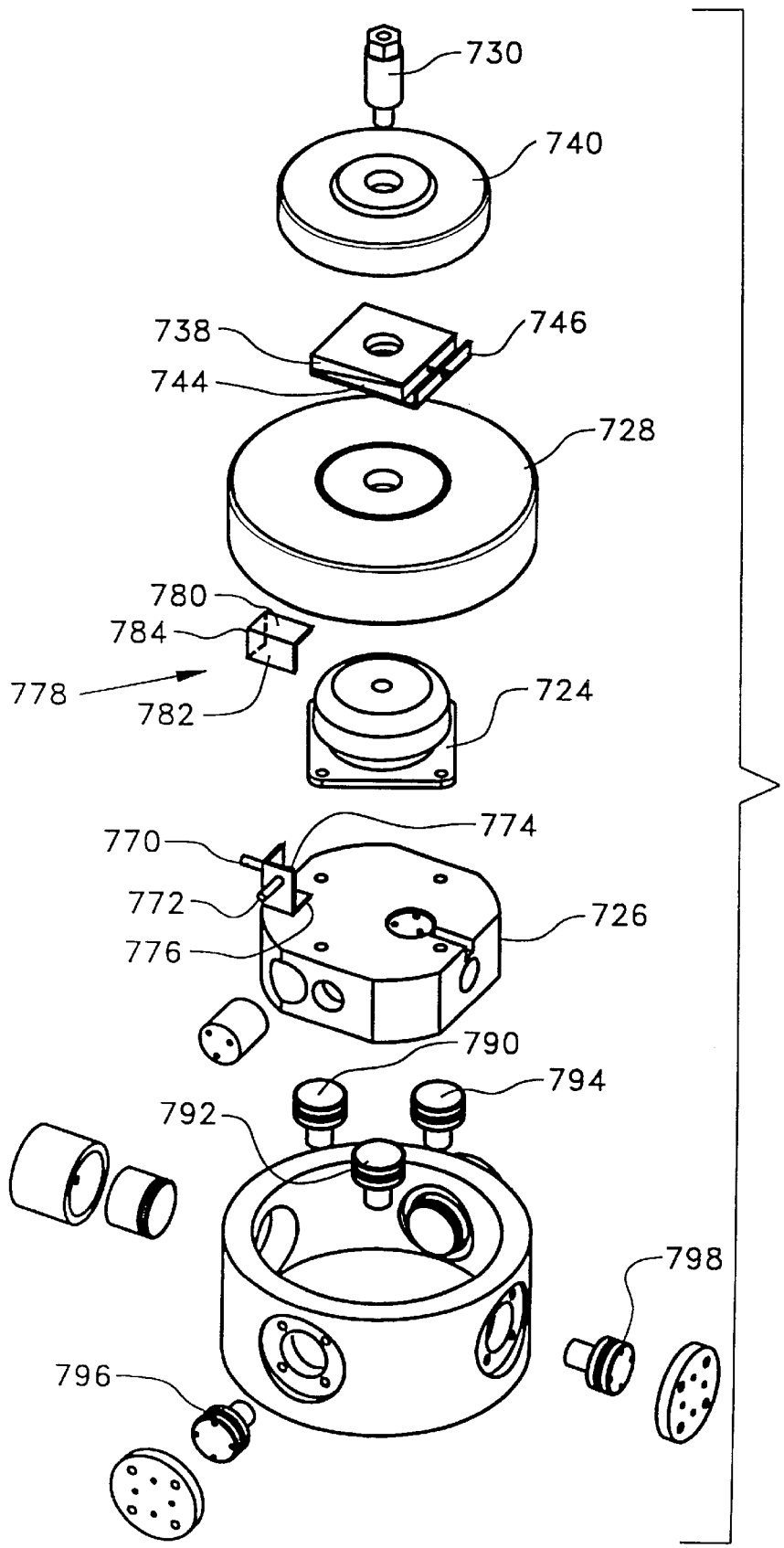
FIG. 17 is an isometric exploded view of a fourth embodiment of the invention employing relative displacement sensors.

FIG. 17 is an isometric view of a further embodiment of the invention which uses both velocity and relative displacement feedback loops. Like characters identify like parts between FIGS. 15 and 17. Note the correct placement of upper wedge 738 and central screw 730. In place of the velocity or inertial displacement sensors mounted in association with the payload as is the case for FIGS. 6–8 and 14–16, this embodiment of the invention uses X, Y and Z relative displacement sensors 770, 772 and 774 mounted on a mounting bracket 776 which in turn is mounted on the top of small mass 726. Displacement sensors 770, 772 and 774 can be any of various kinds of noncontact sensors, including eddy current sensors, reluctors or hall effect sensors. The sensors 770–774 and the mounting bracket 776 cooperate with a triaxial target indicated generally at 778. Target 778, which is made of a ferrous material, is affixed on the underside of cover 728. A plane 780 of the target 778 coacts with Z sensor 774, a plane 782 coacts with Y sensor 772, and a plane 784 (shown in hidden line) coacts with X sensor 770. In an assembled condition, planes 782 and 784 are interpositioned between the upstanding walls of bracket 776 and the Z sensor 784. The bracket 776 is mounted on the upper face of the small mass 726 so as to be radially displaced from the passive isolator 724 but interior of the radial margin of small mass 726. In the instances where sensors 770–774 are eddy current sensors or reluctors, target 778 is selected as ferromagnetic. Leads from each of the sensors 770–774 are provided to compensation circuitry, and signals from these sensors are used in combination with the geophones mounted on and in small mass 726 to control the stiff actuators 790, 792, 794, 796 and 798.

It has been found that the vibrational characteristics of the payload significantly affect the damping performance of the active/passive vibration isolation system. The use of velocity feedback to control the stiff actuators results in the strong coupling of payload vibrational modes to the sensed output. Because the use of "lead-lag" networks (see, e.g., FIG. 3) keep loop gain high, loop closure requires compensation circuits that to at least some extent need to be tailored to the specific payload. Although for any given dynamic system the pole locations are fixed, zero locations, and therefore coupling strength, depend upon the sensor output measured. Choosing a sensor output that results in zeros in close proximity to poles desensitizes the feedback loop to payload dynamics. This can be accomplished by measuring passive mount load or deflection.

While the use of velocity feedback from the payload may require two or more poles to inserted into the compensation circuit comprising the outer or velocity loop, it has been discovered that the use of relative displacement sensors allows the compensation circuitry to be relatively simple.

Figure 22:
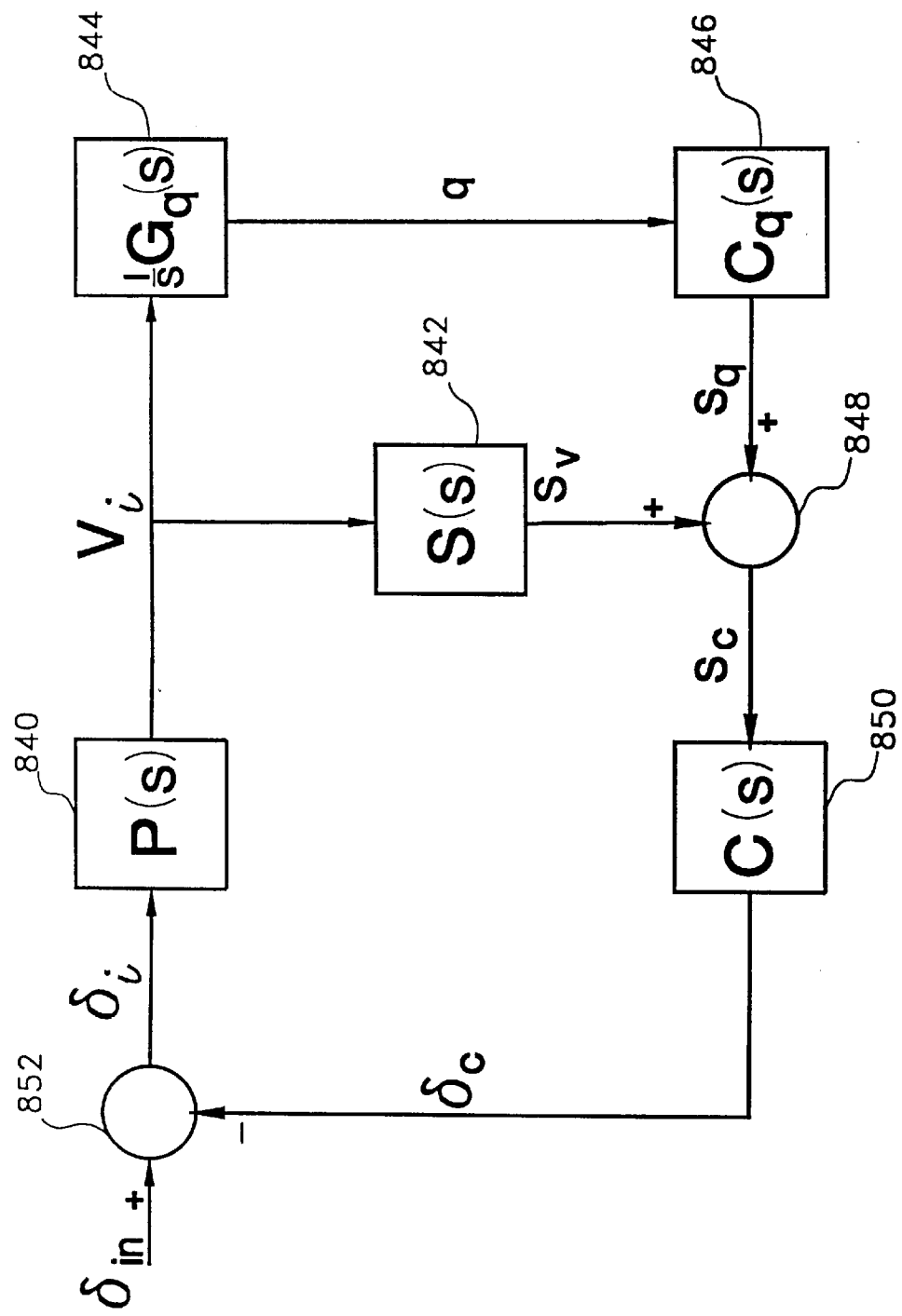
FIG. 22 is a representational block diagram of a system employing relative displacement sensors in an outer control loop.

FIG. 22 is a block diagram representation of the combined inner and outer loops of the system where relative displacement sensors are used for the outer loop compensation. The floor motion is represented at $\delta_{in}$. The intermediate mass inertial displacement $\delta_i$ can (in the vertical direction) be thought of as being measured at the top of the piezoelectric motors. (As in FIG. 19, only one degree of freedom is represented, it being understood that these compensation circuits are duplicated for the other degrees of freedom.) A "plant" block 840 contains function P(s), which is a differentiation from displacement to velocity inherent in the compensation system structure. This produces $v_i$, which is the absolute velocity of the intermediate mass. The geophone sensor dynamics are represented in block 842 as S(s). The small mass absolute velocity also is an input to block 844. This inherent or "plant" function block shows the dynamic relationship between the input $v_i$ and the sensed displacement q, which the inverse LaPlace transform operator 1/S operates in order to differentiate velocity into displacement. The sensed displacement q is input to an outer loop compensator C(s) shown at 846. It has been determined that Cq(s) is preferably the same as C(s) (see equation 9.1), and may be expressed as follows:

$$C_q(s) = \frac{S(\text{Gain})}{(\tau_1 S + 1)(\tau_2 S + 1)} \qquad (10)$$

The passed band for this compensation function is selected as for C(s), and the Bode plots shown in FIGS. 21a and 21b may be used to define $C_q(s)$ as well as C(s).

A filtered signal $S_q$ is summed with a geophone velocity signal $S_v$ at node 848, which produces a combined signal $S_c$. This is compensated by the inner loop compensation function C(s) at step 850. The inner loop compensation function C(s) may be implemented using the analog circuitry shown in FIG. 3 or digitally. The Bode plots for C(s) are shown in FIGS. 20a and 20b. The inner loop compensation function C(s) produces the piezoelectric stack displacement $\delta_c$, which is summed with the environmental displacement $\delta_{in}$ at node 852. The selection of $1/\tau_1$ will depend upon the intended payload. The payload also influences the selection of $1/96_2$, although to a lesser degree.

In summary, an active vibration isolation system has been shown and described. The isolation system according to the invention interposes a small mass between the payload mass and supporting stiff actuator elements to reduce the resonant frequency and necessary gain. Circuitry is provided to drive the stiff actuators as a function of displacement signals generated from sensors in the small mass in each of three directions. This circuitry has compensation circuits within it to filter certain resonant modes inherent in the structure. To provide passive vibration isolation outside of the range of the active vibration isolation frequency, a passive isolator is interposed between the small mass and the payload mass. Preferably, the small mass is received into a case and is supported from the bottom and walls of the case by "X", "Y" and "Z" stiff actuator elements. The case also provides a method of exerting compressive force against the horizontal piezoelectric motors. The present invention uses novel signal filtration techniques that provide a "notch" filtering characteristic without altering the overall gain of the circuit.

While illustrative embodiments have been described in the above detailed description, the invention is not limited thereto but only by the scope and spirit of the appended claims.

We claim:

1. An active vibration isolation system for isolating a payload mass from a source of vibration, said active vibration isolation system comprising:

a small mass;

at least one stiff actuator having first and second opposed ends and variable in length between the first and second opposed ends, the first end coupled to said small mass and the second end coupled to the source of vibration;

a passive isolator interposed between said small mass and said payload mass, wherein said stiff actuator, said small mass and said passive isolator are interposed between said payload mass and the source of vibration;

a sensor coupled to said small mass to generate a sensor signal which is a function of the movement of said small mass; and circuitry coupling said sensor to said stiff actuator and receiving said sensor signal, said circuitry including compensation circuitry to alter said sensor signal such that said active vibration isolation system will be stable over a predetermined range of vibration frequencies and payload masses, said circuitry further including control circuitry coupled to said stiff actuator for varying the length of said stiff actuator as a function of said altered sensor signal.

2. The active vibration isolation system as recited in claim 1, wherein said sensor signal is a velocity signal indicating velocity of said small mass, said circuitry including a velocity integrator for integrating said velocity signal to derive a displacement signal and having an output for said displacement signal, said compensation circuitry coupled to said output of said velocity integrator.

3. The active vibration isolation system as recited in claim 1, wherein said compensation circuitry includes a DC blocking circuit for blocking DC voltage from said sensor.

4. The active vibration isolation system as recited in claim 3, wherein said DC blocking circuit has the transfer function:

$$\frac{S}{S + W_1}$$

where S is the LaPlace transform operator and $W_1$ is a frequency of about 0.3 hertz.

5. The active vibration isolation system as recited in claim 1, wherein said compensation circuitry includes a lowfrequency compensation circuit with a transfer function:

$$\frac{1+T_{C2}S}{1+T_{C1}S},$$

wherein S is the Laplace transform operator, $T_{C1}$ is a preselected first time constant and $T_{C2}$ is a preselected second time constant which is about twenty times shorter than said first time constant.

6. The active vibration isolation system as recited in claim 5 wherein said sensor has a suspension frequency, $T_{C1}$ being approximately matched to said suspension frequency.

7. The active vibration isolation system as recited in claim 1, wherein said compensation circuitry includes a lead phase increase circuit which adds phase lead in the frequency region of resonance of said passive isolator.

8. The active vibration isolation system as recited in claim 7, wherein said lead phase increase circuit comprises two series-connected analog lead lag stages having two poles and two zeroes.

9. The active vibration isolation system as recited in claim 1, wherein said compensation circuitry comprises a high frequency gain reduction circuit operating on said sensor signal to reduce the gain thereof to unity at a point in the frequency domain substantially less than the resonance frequency formed by spring constant of said stiff actuator and said small mass.

10. The active vibration isolation system as recited in claim 9, wherein said high frequency gain reduction circuit has a transfer function:

$$\left(\frac{1}{1+T_{C3}S}\right)^2$$

where S is the LaPlace Transform Operator and $1/TC3$ is said unity gain point in the frequency domain.

11. The active vibration isolation system as recited in claim 10, wherein said high frequency gain reduction circuit comprises two series-connected lag lead circuits each having a pole at a first frequency prior to said unit gain point and a zero at a second frequency after said unity gain point.

12. The active vibration isolation system as recited in claim 1, wherein said compensation circuitry includes a notch filter circuit having a notch of low gain at a resonance frequency caused by the interaction of said small mass, said payload mass and said passive isolator.

13. An active vibration isolation system for isolating a payload from movement in first, second and third axes which are orthogonal to each other, said active vibration isolation system comprising:

an intermediate mass;

first, second and third stiff actuators having variable lengths respectively aligned with the first, second and third axes, each one of the first, second and third stiff actuators having a first end coupled to said intermediate mass and a second end coupled to a support susceptible to vibration;

first, second and third sensors coupled to said intermediate mass and operable to sense movement along first, second and third directions, respectively, the first direction parallel with the first axis, the second direction parallel to the second axis, the third direction parallel to the third axis, said first, second and third sensors respectively generating first, second and third sensor signals; and circuitry coupled to said first, second and third sensors for generating a first control signal as a function of the first sensor signal, a second control signal as a function of the second sensor signal and a third control signal as a function of the third sensor signal, wherein the first, second and third control signals respectively govern operation of the first, second and third stiff actuators.

14. The active vibration isolation system as recited in claim 13, wherein the first end of said first, second and third stiff actuator is coupled to said small mass by a separate shear decoupler.

15. A method of actively isolating a payload from vibration, comprising the steps of:

resting the payload on a passive isolator;

coupling the passive isolator to a small mass which is at least one order of magnitude smaller than a predetermined range of payload masses;

supporting the small mass from a base susceptible to vibration by at least one stiff actuator;

sensing the movement of the small mass; generating a small mass sensor signal which is a function of the movement of the small mass;

generating a control signal which is a function of the small mass sensor signal;

applying the control signal to the stiff actuator; and responsive to said step of applying, varying a length of the stiff actuator, thereby reducing the vibration experienced by the payload.

16. The method as recited in claim 15, wherein the sensor signal is a function of the velocity of the small mass.

17. The method as recited in claim 16, and further comprising the steps of: integrating the sensor signal to obtain a small mass displacement signal; and deriving the control signal as a function of the small mass displacement signal.

18. The method as recited in claim 15, and further comprising the steps of: modifying the sensor signal to compensate for at least one resonant frequency of the active vibration isolation apparatus; and generating the control signal as a function of the modified sensor signal.

19. The method recited in claim 15, and further comprising the steps of:

sensing the movement of the payload; generating a payload sensor signal as a function of movement of the payload; and generating the control signal as a function of the sensor signal and the payload sensor signal.

* * * * *